United States Patent
Piazza et al.

(10) Patent No.: US 10,033,568 B2
(45) Date of Patent: Jul. 24, 2018

(54) METHODS, DEVICES, AND COMPUTER PROGRAMS FOR COMPENSATING NONLINEARITIES OF A COMMUNICATION CHANNEL

(71) Applicant: SES S.A., Betzdorf (LU)

(72) Inventors: Roberto Piazza, Luxembourg (LU); Bhavani Shankar Bysore Rama Rao, Luxembourg (LU); Bjorn Ottersten, Luxembourg (LU)

(73) Assignee: SES S.A., Betzdorf (LU)

( * ) Notice: Subject to any disclaimer, the term of this patent is extended or adjusted under 35 U.S.C. 154(b) by 0 days.

(21) Appl. No.: 15/323,794

(22) PCT Filed: Jul. 4, 2014

(86) PCT No.: PCT/EP2014/064311
§ 371 (c)(1),
(2) Date: Jan. 4, 2017

(87) PCT Pub. No.: WO2016/000787
PCT Pub. Date: Jan. 7, 2016

(65) Prior Publication Data
US 2017/0163465 A1    Jun. 8, 2017

(51) Int. Cl.
*H04L 25/49* (2006.01)
*H04L 27/36* (2006.01)
(Continued)

(52) U.S. Cl.
CPC ............ *H04L 27/368* (2013.01); *H04B 7/00* (2013.01); *H04L 1/0042* (2013.01); *H04L 1/248* (2013.01);
(Continued)

(58) Field of Classification Search
CPC ........ H03F 1/3247; H03F 1/3258; H03F 3/24; H04L 27/368; H04L 27/2626; H04L 27/2627
(Continued)

(56) References Cited

U.S. PATENT DOCUMENTS 5,598,436 A    1/1997  Brajal et al.
7,366,252 B2   4/2008  Cova et al.
(Continued)

FOREIGN PATENT DOCUMENTS

EP    1 063 825 A2    12/2000
EP    2 530 832 A1    12/2012
(Continued)

OTHER PUBLICATIONS

Bassam et al., Linearization of Concurrent Dual-Band Power Amplifier Based on 2D-DPD Technique. IEEE Microwave and Wireless Components Letters. Dec. 2011;21(12):685-7.
(Continued)

*Primary Examiner* — Khai Tran
(74) *Attorney, Agent, or Firm* — Wolf, Greenfield & Sacks, P.C.

(57) ABSTRACT

A method, carried out by a gateway transmitter (400), aims at compensating the nonlinearities of a communication channel (500) comprising a repeater (510). A plurality of digital signals is modulated (s10) on a plurality of carriers, wherein symbols of the constellation diagram used for modulation of each carrier are distorted in accordance with a pre-distortion function. The modulated signals are then frequency division multiplexed (s20), and sent (s30) for transmission, through the communication channel (500), to at least one receiver (600). The pre-distortion function involves a plurality of polynomial functions, each of which taking as input the symbols from all the carriers. The
(Continued)

polynomial functions' coefficients, called "pre-distortion coefficients", are computed according to a direct learning approach, performed jointly for the plurality of carriers. The pre-distortion coefficients are iteratively updated based on received signals being fed back from a receiver (600). The invention also relates to transmitters and computer programs.

20 Claims, 15 Drawing Sheets

(51) Int. Cl.
    *H04L 5/06*     (2006.01)
    *H04L 1/00*     (2006.01)
    *H04L 1/24*     (2006.01)
    *H04B 7/00*     (2006.01)
    *H04L 27/00*     (2006.01)

(52) U.S. Cl.
    CPC ............... *H04L 5/06* (2013.01); *H04L 25/49* (2013.01); *H04L 2027/0026* (2013.01)

(58) Field of Classification Search
    USPC .................................. 375/296, 295; 330/149
    See application file for complete search history.

(56) References Cited

U.S. PATENT DOCUMENTS

| | | | |
|---|---|---|---|
| 8,233,562 | B2 | 7/2012 | Eymann |
| 8,576,941 | B2 * | 11/2013 | Bai .................. H03F 1/3247 375/295 |
| 2002/0187761 | A1 | 12/2002 | Im et al. |
| 2005/0024138 | A1 | 2/2005 | White et al. |
| 2009/0052507 | A1 | 2/2009 | Eymann |
| 2010/0148865 | A1 | 6/2010 | Borkar et al. |
| 2011/0175678 | A1 | 7/2011 | Velazquez |
| 2012/0027070 | A1 | 2/2012 | Beidas |
| 2012/0069931 | A1 | 3/2012 | Gandhi et al. |
| 2012/0128098 | A1 * | 5/2012 | Haddad .................. H03F 1/3247 375/296 |
| 2013/0077713 | A1 | 3/2013 | Kim et al. |
| 2013/0120062 | A1 | 5/2013 | Lozhkin |
| 2014/0009228 | A1 | 1/2014 | Hawkes |
| 2016/0191290 | A1 * | 6/2016 | Kim ..................... H04B 7/0413 375/295 |

FOREIGN PATENT DOCUMENTS

| | | |
|---|---|---|
| KR | 1020080094196 A | 10/2008 |
| WO | WO 2001/029963 A1 | 4/2001 |
| WO | WO 2002/017586 A1 | 2/2002 |
| WO | WO 2005/091865 A2 | 10/2005 |
| WO | WO 2006/031156 A1 | 3/2006 |
| WO | WO 2008/058806 A1 | 5/2008 |

OTHER PUBLICATIONS

Beidas, Intermodulation Distortion in Multicarrier Satellite Systems: Analysis and Turbo Volterra Equalization. IEEE Transactions on Communications. Jun. 2011;59(6): 1580-90.

Eun et al., A New Volterra Predistorter Based on the Indirect Learning Architecture. IEEE Transactions on Signal Processing. Jan. 1997;45(1):223-7.

Hussein et al., On the system level convergence of ILA and DLA for digital predistortion. 2012 International Symposium on Wireless Communication Systems (ISWCS). Aug. 2012; p. 870-4.

Kelly et al., Digital Predistortion Feasibility Studies for Multicarrier Satellite Communication Systems. 30th AIAA International Communications Satellite Systems Conference (ICSSC) 2013, Florence, 13 pages.

[No Author Listed], IMUX & OMUX. Thales Group Website. http://www.thalesgroup.com/sites/default/files/asset/document/Imux_Omux.pdf [last accessed Apr. 24, 2017].

[No Author Listed], M6100 Broadcast Satellite Modulator. Newtec Website. http://www.newtec.eu/product.m6100-broadcast-satellite-modulator [last accessed Apr. 24, 2017].

Piazza et al., Data Predistortion for Multicarrier Satellite Channels Based on Direct Learning. IEEE Transactions on Signal Processing. Nov. 15, 2014; 62(22):5868-80.

Piazza et al., Data Predistortion for Multicarrier Satellite Channels Using Orthogonal Memory Polynomials. International Workshop on Signal Processing Advances for Wireless Communication. Jun. 16, 2013; 1 page, (Poster).

Piazza et al., Multicareer LUT-based Data Predistortion for Non-linear Satellite Channels. International Conference on Communication. Jun. 13, 2014; 16 slides.

Piazza et al., Multicarrier Digital Pre-distortion/ Equalization Techniques for Non-linear Satellite Channels. 30th AIAA International. Communications. Satellite System Conference. 2012; 15 pages.

Piazza et al., Multicarrier Digital Pre-distortion/Equalization Techniques for Non-linear Satellite Channels. 30th AIAA International Communications Satellite Systems Conference (ICSSC). Ottawa, Canada. Sep. 25, 2012; 23 Slides.

Piazza et al., Multicarrier LUT-based Data Predistortion for Non-linear Satellite Channels. International Conference on Communication, 2014; 6 pages.

Piazza et al., Sensitivity Analysis of Multicarrier Digital Pre-distortion/ Equalization Techniques for Non-linear Satellite Channels. 31st AIAA International Communications Satellite Systems Conference (ICSSC). Florence, Oct. 17, 2013; 20 slides.

Piazza et al., Sensitivity Analysis of Multicarrier Digital Pre-distortion/ Equalization Techniques for Non-linear Satellite Channels. In 31st AIAA International Communications Satellite Systems Conference (ICSSC) 2013, Florence, 16 pages.

International Search Report and Written Opinion dated Apr. 24, 2015 in connection with International Application No. PCT/EP2014/064311.

International Preliminary Report on Patentability dated Jun. 14, 2016 in connection with International Application No. PCT/EP2014/064311.

Piazza et al., Data Predistortion for Multicarrier Satellite Channels using Orthogonal Memory Polynomials. 2013 IEEE 14$^{th}$ Workshop on Signal Processing Advances in Wireless Communications (SPAWC). IEEE. Jun. 16, 2013; XP032490499:689-93.

Zhou et al., Novel Adaptive Nonlinear Predistorters Based on the Direct Learning Algorithm. IEEE Transactions on Signal Processing, Jan. 1, 2007; 55(1):120-33.

* cited by examiner

Single-carrier system

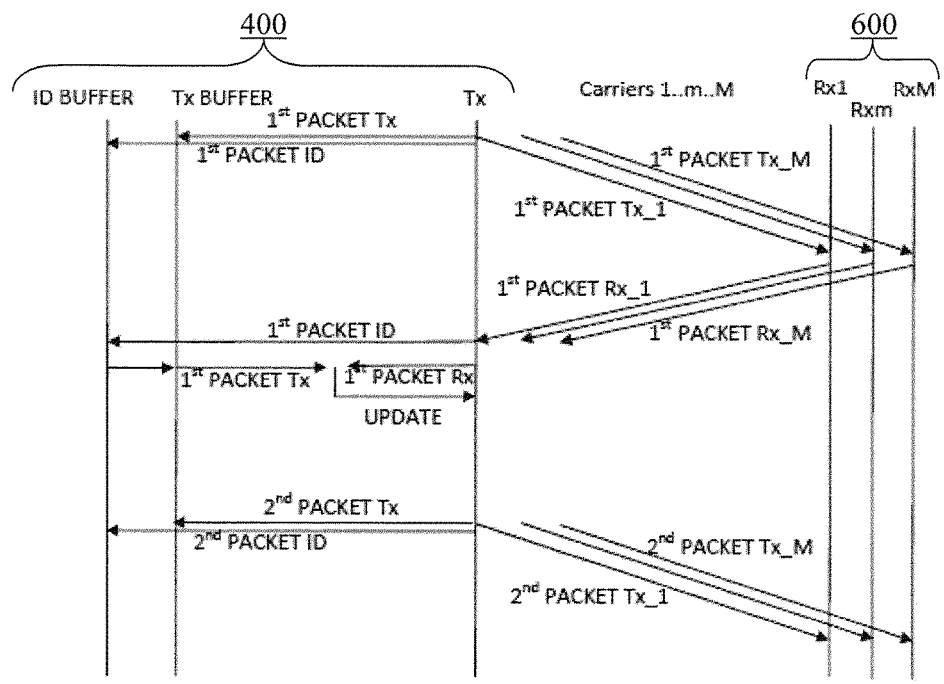
Fig. 19a
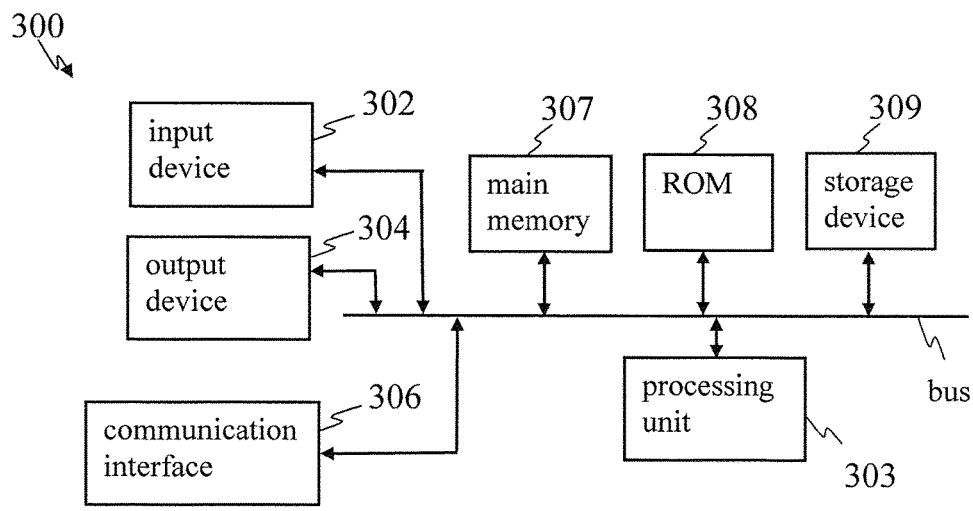
Fig. 19b
Fig. 20

METHODS, DEVICES, AND COMPUTER PROGRAMS FOR COMPENSATING NONLINEARITIES OF A COMMUNICATION CHANNEL

TECHNICAL FIELD

The present invention relates to methods, devices, and computer programs for compensating, at least partially, nonlinearities of a communication channel. The invention may notably be used, but is not limited thereto, in satellite communications systems, to compensate, at least partially, nonlinearities of satellite communication channels.

BACKGROUND

There is a constant need, in telecommunications, to provide high data transmission rates. This need, together with the demand for ubiquitous connectivity, is exemplified in the context of providing broadband Internet connectivity by satellite. Satellites with multiple spot beam coverage are for example being provided, such as the ViaSat-1 satellite, launched in 2011 and considered one of the highest capacity communications satellites, with a total throughput of about 140 Gbit/s.

To meet this need, changes to the satellite payload architecture and the communication methodology are researched. Transition from single beam to multiple beam systems is an evidence of the former. While advanced payload architectures are being considered, it is also useful to address the transmitter and receiver-based digital processing techniques being used, particularly in view of efficiently using the available electromagnetic spectrum, being a scarce resource.

Some transmitter and receiver-based digital processing techniques are specifically adapted for situations where a single amplifier on board a satellite is used for amplification of multiple satellite links. With the development of wideband amplifiers, joint amplification of multiple carriers allows saving of the payload mass in comparison to the traditional single amplifier per link case. The sharing of satellite payload among many links reduces the hardware costs and complexity, and also provides a degree of flexibility for system designers by making a wide range of configurations available (such as for example the bandwidth of the carriers, the number of carriers, and the carrier spacing) without requiring changes on-board the satellite.

Efficient amplification is, however, typically a non-linear operation and joint amplification of multiple carriers leads to spurious inter-modulation products. This, coupled with the on-board filtering, leads to distortions caused by symbols from other carriers, i.e. adjacent-channel interference (ACI), or from the same carrier itself, i.e. intersymbol interference (ISI). These distortions can cause severe degradation in the link performance, all the more so for higher order (spectrally efficient) modulations. In the absence of compensation techniques, either a large guard-band between the carriers should be used and/or the amplifier should be operated in a linear region. The former results in inefficient frequency carrier segregation, while the latter translates into a power loss compared to single carrier operations depending on the spectral efficiencies of the individual carriers. The benefit of joint amplification in terms of mission costs is more than offset by the loss in power and spectral efficiencies.

To overcome this situation, mitigation techniques are needed, and should be implemented on the ground, to provide upgrade flexibility while keeping the payload complexity intact. The techniques at the transmitter are called "pre-distortion", whereas those at the receiver are known as "equalization" (EQ). Some on-ground digital processing techniques are used to minimize ISI and ACI effects in a multiple carrier system with high power amplifier (HPA) on board a transparent (or "bent pipe") satellite. Transparent satellites receive the data-bearing signals from one or more gateways and then redirect them to the ground receivers after performing frequency translation and amplification, as needed.

Single carrier techniques cannot be used in a straightforward manner for multiple carrier techniques, due to the joint processing at the gateway and the absence of adjacent carriers in single carrier techniques. In multicarrier signal digital pre-distortion (DPD) techniques, the compensation technique acts on the superposition of the carriers, prior to transmission on the uplink channel to the satellite. In multicarrier data DPD techniques, the processing occurs at the carrier level, before pulse-shaping, frequency translation, superposition of the carriers, and uplink transmission to the satellite. In both multicarrier signal and data DPD techniques, no change is required to the functions of the satellite transponder and the receivers.

R. Piazza et al, "Multicarrier Digital Pre-distortion/Equalization Techniques for Non-linear Satellite Channels," Proc. of the 30th AIAA International Communications Satellite Systems Conference (ICSSC-2012), Ottawa, Canada, 24-27 Sep. 2012, discusses the use of DPD and EQ as mitigation techniques in a multiple carrier scenario, i.e. a scenario where multiple carriers are amplified by a single HPA.

N. Kelly et al, "Digital Predistortion Feasibility Studies for Multicarrier Satellite Communication Systems," Proc. of the 31th AIAA International Communications Satellite Systems Conference (ICSSC-2013), Florence, Italy, Oct. 14-17, 2013, discusses the applicability of DPD techniques to the linearization of multicarrier satellite communication systems. The paper focuses on a signal DPD technique, involving pre-distortion applied after combining the multiple carriers into a single multicarrier signal.

U.S. Pat. No. 5,598,436 relates to the distortion of a modulation constellation in a monocarrier system (col. 1, lines 64-67) and the distortion of a single OFDM multicarrier signal in a multicarrier system (col 2, lines 30-33; FIGS. 9 and 11).

It is desirable to improve the methods of the prior art, with in mind notably the system performance, processing requirements, complexity and robustness to noise.

SUMMARY

To meet or at least partially meet the above-mentioned goals, methods, transmitters and computer programs according to the invention are defined in the independent claims. Particular embodiments are defined in the dependent claims.

In one embodiment, a method is carried out by a transmitter (hereinafter referred to as "gateway transmitter") for compensating, at least partially, the nonlinearities of a communication channel comprising at least one repeater. In the method, a plurality of digital signals are modulated on a plurality of carriers respectively, and the symbols of the constellation diagram used for modulation of each carrier are distorted in accordance with a function, hereinafter referred to as "pre-distortion function". The plurality of modulated digital signals are then frequency division multiplexed. The frequency division multiplexed plurality of modulated digital signals is sent for transmission, through the communication channel, to at least one receiver. The pre-distortion function involves a plurality of polynomial functions, each of which taking as input the symbols from all the carriers, and the polynomial functions' coefficients being hereinafter referred to as "pre-distortion coefficients". The pre-distortion coefficients are computed in accordance with a direct learning approach, wherein this computation is performed jointly for the plurality of carriers, and the computation comprises iteratively updating the pre-distortion coefficients based on received signals being fed back from at least one among the at least one receiver to the gateway transmitter.

The method enables to enhance the performance of the non-linearity compensation in a multi-carrier context thanks to the higher robustness to receiver noise. In particular, the pre-distortion carried out prior to multiplexing in conjunction with the use of a direct-learning method provides a synergistic effect going beyond the techniques known in the prior art. The method also requires a relatively simple architecture.

The invention also relates, in one embodiment, to a gateway transmitter for compensating, at least partially, the nonlinearities of a communication channel comprising at least one repeater. The gateway transmitter comprises a modulating unit, a multiplexing unit, and a sending unit. The modulating unit is configured for modulating a plurality of digital signals on a plurality of carriers respectively, wherein, in operation, symbols of the constellation diagram used for modulation of each carrier are distorted in accordance with a pre-distortion function. The multiplexing unit is configured for frequency division multiplexing the modulated digital signals. The sending unit is configured for sending the frequency division multiplexed plurality of modulated digital signals for transmission, through the communication channel, to at least one receiver. The pre-distortion function used in the gateway transmitter involves a plurality of polynomial functions, each of which taking as input the symbols from all the carriers. The polynomial functions' coefficients are referred to as "pre-distortion coefficients". Those are computed in accordance with a direct learning approach, the computation being performed jointly for the plurality of carriers, and the computation comprising iteratively updating the pre-distortion coefficients based on received signals being fed back from at least one among the at least one receiver to the gateway transmitter.

The invention also relates, in one embodiment, to a system comprising a gateway transmitter as described above, and one or more repeater on a communication channel as described above.

The invention further relates to computer programs, computer program products and storage mediums comprising computer-readable instructions configured, when executed on a computer, to cause it to carry out steps of the above-described method, or to implement functions of the above-described gateway transmitter.

In one embodiment, a computer program comprises computer-readable instructions configured, when executed on a computer, to cause it to determine pre-distortion coefficients involved in a pre-distortion function for use in distorting symbols of each of the constellation diagrams used for modulation of, respectively, a plurality of carriers carrying a plurality of digital signals. The distorting is suitable, in a gateway transmitter, to compensate, at least partially, the nonlinearities of a communication channel comprising at least one repeater. Further, distorting is carried out prior to frequency division multiplexing the modulated digital signals, and prior to sending the multiplexed signals for transmission, through the communication channel, to at least one receiver. The pre-distortion function involves a plurality of polynomial functions, each of which taking as input the symbols from all the carriers, the polynomial functions' coefficients being the above-mentioned pre-distortion coefficients. The pre-distortion coefficients are computed in accordance with a direct learning approach, said computation being performed jointly for the plurality of carriers, and said computation comprising iteratively updating the pre-distortion coefficients based on received signals being fed back from at least one among the at least one receiver.

BRIEF DESCRIPTION OF THE DRAWINGS

Embodiments of the present invention shall now be described, in conjunction with the appended figures, in which:

FIGS. 19a and 19b illustrate a method in one embodiment of the invention, involving the buffering of packets at the gateway transmitter, and the use of packet identifiers, to update the pre-distortion coefficients;

FIG. 20 schematically illustrates an exemplary implementation of a computer that may be used in some embodiments of the invention.

DETAILED DESCRIPTION

The present invention shall now be described in conjunction with specific embodiments. These specific embodiments serve to provide the skilled person with a better understanding, but are not intended to in any way restrict the scope of the invention, which is defined by the appended claims. A list of abbreviations and their meaning is provided at the end of the detailed description.

Figure 1:
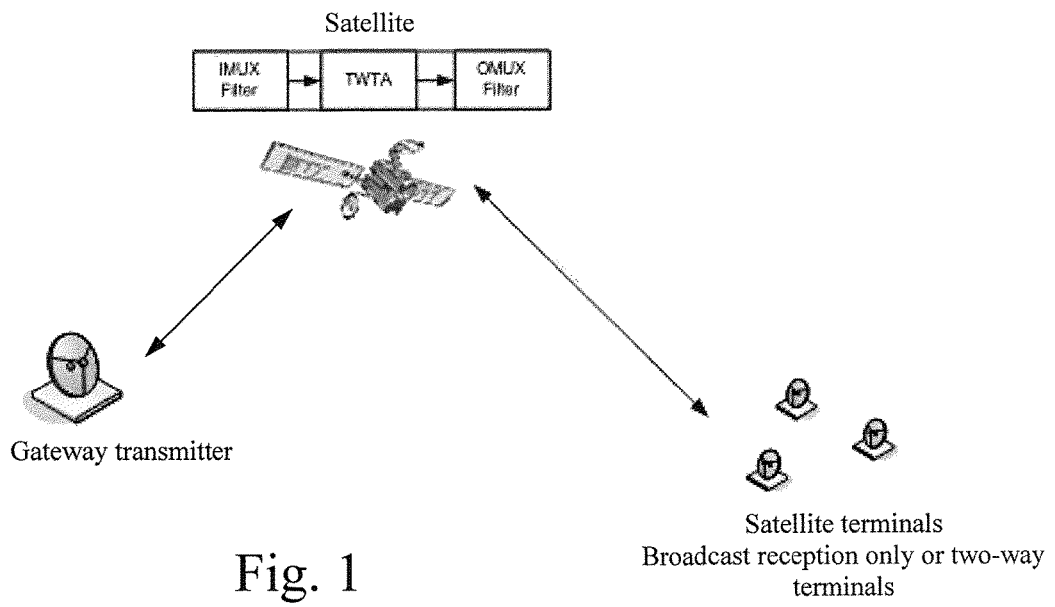
FIG. 1 schematically illustrates, to understand the context in which some embodiments of the invention may be put in practice, a possible model of a path between a gateway transmitter and receivers in a satellite communication system.

FIG. 1 schematically illustrates, to understand the context in which some embodiments of the invention may be put in practice, a possible model of a path between a transmitter ("gateway transmitter") and receivers in a transparent satellite communication. The entities involved are (i) the gateway transmitter, (ii) a satellite wideband transponder including an input multiplexing (IMUX) filter, a HPA, and an output multiplexing (OMUX) filter, and (iii) the receivers. IMUX filters are used to reject out-of-band signals and noise from entering the satellite chain. The OMUX filter rejects the out-of-band spectra caused by the non-linear amplification so as to reduce inter-beam interference. Characteristics of exemplary IMUX and OMUX filters, which may be used for space applications, are discussed in the document entitled "IMUX & OMUX" from the Thales Group web site, available from the URL https://www.thalesgroup.com/sites/default/files/asset/document/Imux_Omux.pdf (retrieved on 21 May 2014).

Travelling wave tube amplifiers (TWTA) may for example be used as on board HPA and are intrinsically non-linear. The TWTAs may be used in the so-called $K_a$ band (26.5-40 GHz), for example.

FIGS. 2 to 6 relate to a single carrier amplification system, which is here discussed to introduce some concepts that may be useful to understand some embodiments of the invention.

Figure 2:
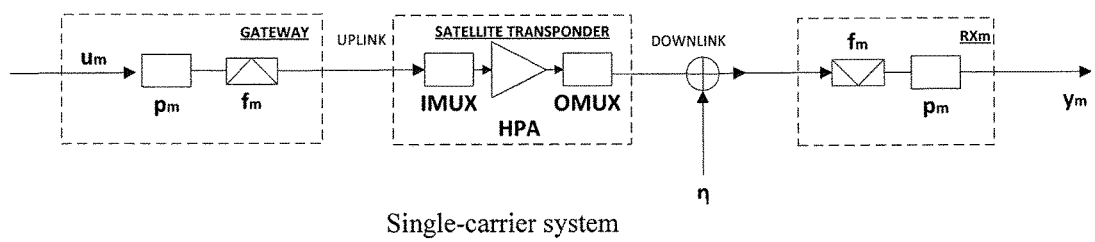
FIGS. 2 to 6 relate to a single carrier system, discussed to introduce concepts useful to understand some embodiments of the invention.
Figure 3:
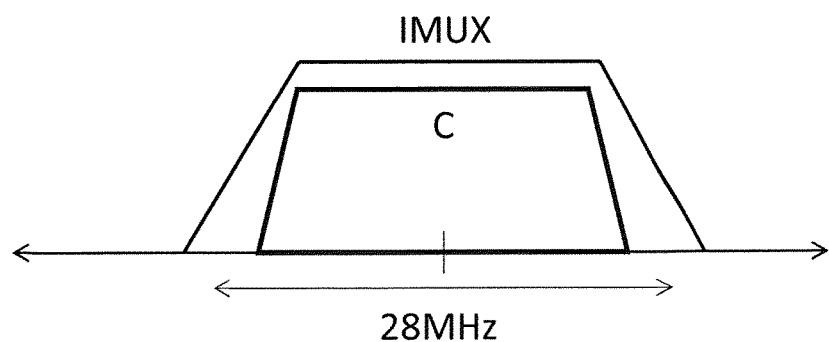
Figure 4:
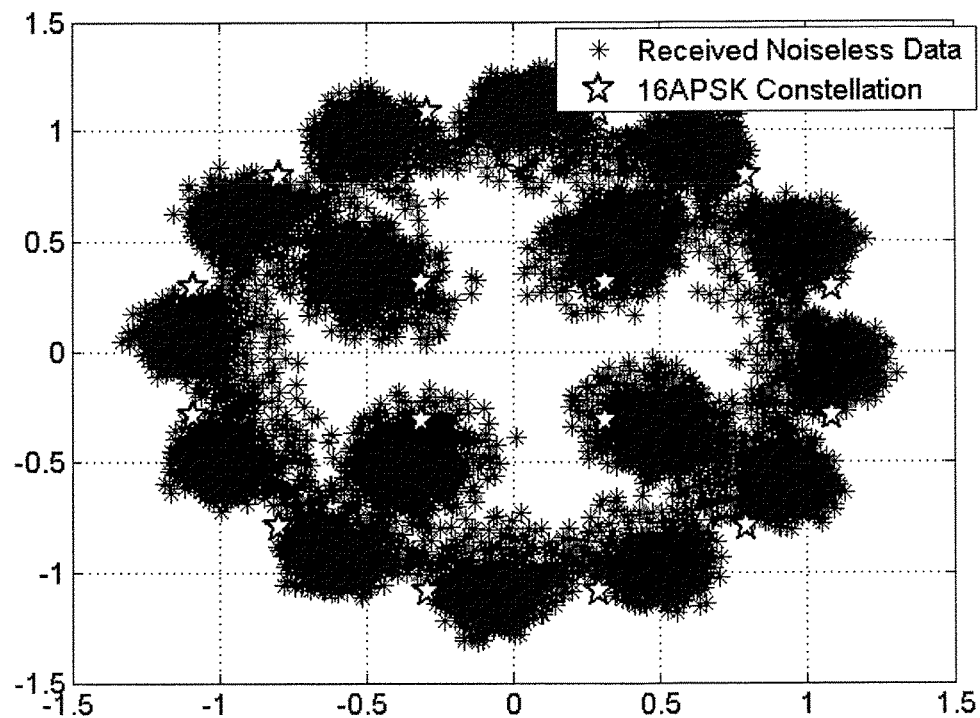

FIG. 2 schematically illustrates a single carrier system, wherein $u_m$ is the carrier, $p_m$ is a pre-defined pulse shaping filter function, $f_m$ represents the process of translating the signals from the baseband to the passband (in the gateway) and from the passband to the baseband (in the receivers $RX_m$), and $\eta$ is the receiver noise. Although $\eta$ is herewith referred to as the receiver noise, the uplink and transponder also contribute, to a smaller extent, to the noise. FIG. 3 illustrates, in a single carrier transmission scenario, the position of the carrier (labelled "C") with regards to the on-board IMUX/OMUX frequency response (labelled "IMUX"). FIG. 4 represents 10000 received symbols collected after transmitting as many symbols from the gateway using a 16 amplitude phase shift keying (APSK) constellation. The small, white, five-pointed star symbols in FIG. 4 correspond to the original transmitted symbols, whereas the black dots represent the received symbols. FIG. 4 shows the distortions introduced by the satellite channel: (i) clustering due to ISI, and (ii) warping, i.e. the centroids of the clusters do not coincide with the transmitted constellation.

Figure 5:
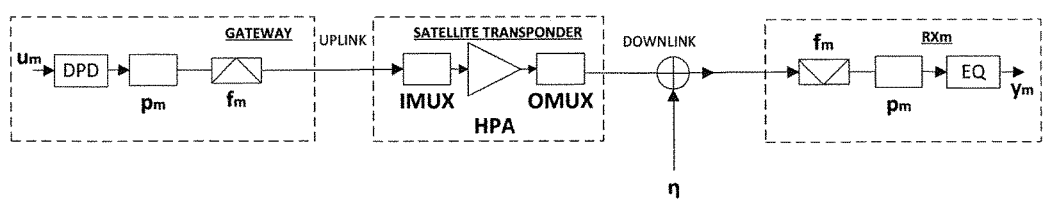

To perform compensation by minimizing the distortion in the single carrier case, and thus to improve performance, pre-distortion at the transmitter and equalization at the receiver may be provided. FIG. 5 schematically illustrates an exemplary implementation of a single carrier system where data DPD is carried out along with a symbol-spaced equalizer (EQ). For implementing the data DPD, different techniques may be used, including:

Model-based techniques: The data DPD is modelled as implementing a complex function of the input symbols. The function has several parameters that are optimized to minimize the distortions. Some aspects in such architectures are:
Choice of the function: Volterra series, memory polynomials and orthogonal memory polynomials may for example be used.
Technique to optimize the parameters of the function: This process, also called "learning" or "training", allows for the estimation of the coefficients of the above-mentioned polynomials, for example. In that respect, a direct or indirect learning method may be used. These learning methods are discussed in more detail below.

Look-up table method: An offline processing is used to generate a look-up table to determine the output for different input combinations. For example, a 16×16 table may be used for a 16 APSK constellation for a simple system whose characteristic is frequency independent. For systems with frequency-dependent characteristics, much larger tables may be required.

Let us now discuss the direct and indirect learning methods.

In an indirect learning technique, an equalizer is designed instead of a predistorter. Ideally, pre-compensation and post-compensation achieve similar objectives and hence obtaining an equalizer having the same model as the predistorter would be as good as deriving the predistorter per se. This idea is particularly appealing since the parameters can be found at the receiver and then passed onto the transmitter for use as predistorter. Another way of implementing an indirect learning method may be to feed the received signal back to the transmitter and perform computation there. The computation being performed is the same, but the location where the computation is performed may be either on the transmitter or receiver side. While the process has a solid theoretical backing in the ideal case, the inventors have notably recognized that indirect learning methods are sensitive to noise at the receiver so that pre-compensation and post-compensation are in fact not the same.

In a direct learning technique, the estimation of the model parameters is performed at the transmitter in conjunction with the receiver. The received data is fed from the receiver back to the transmitter and, based on an iterative update process, the predistorter models are modified to reduce the dissimilarity between the transmitted and received symbols. Since the transmitter is privy to the transmitted symbols, a measure of dissimilarity can be easily found once the feedback is received. Such a learning technique is robust notably because it takes the receiver noise into account (since the feedback contains noise), but requires feedback from the receiver.

Figure 6:
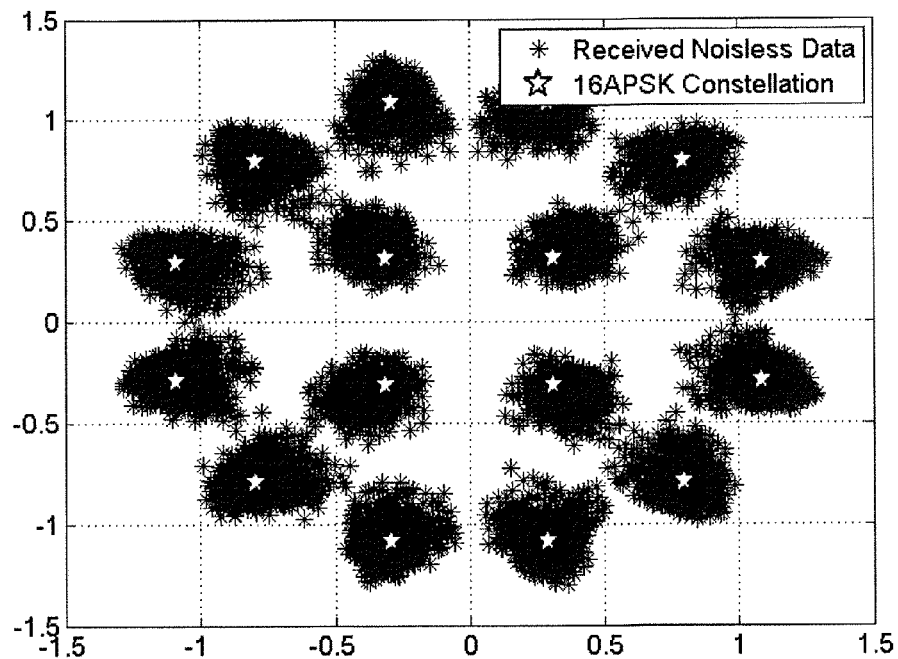

FIG. 6 illustrates, compared to FIG. 4, the performance improvement obtained by a memory polynomial based predistorter having six parameters obtained by indirect learning. Compared to FIG. 4, the scatter plot better reflects the transmitted points, showing that the DPD technique reduces signal degradation and saves power on board the satellite (power being a scarce on-board resource).

FIGS. 7, 8, 9a, 9b, and 9c relate to a multiple carrier amplification system, which is discussed here to introduce some concepts that may be useful to understand some embodiments of the invention.

Figure 7:
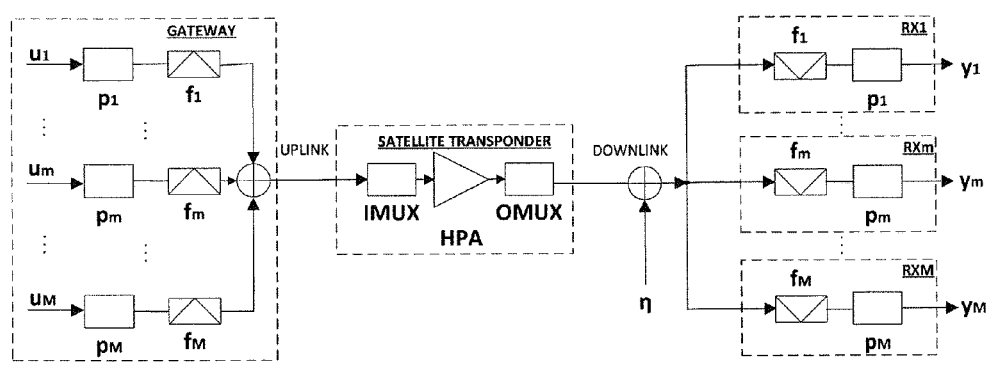
FIGS. 7 to 9c relate to a multiple carrier system, also discussed to introduce concepts useful to understand some embodiments of the invention.

FIG. 7 schematically illustrates a multiple carrier system, with joint filtering and amplification on board the satellite, wherein $u_1, \ldots, u_M$ are the symbols on the carriers, $p_1, \ldots, p_M$ are pre-defined pulse shaping filter functions, $f_1, \ldots, f_M$ represent the process of translating the signals from the baseband to the passband (in the gateway) and from the passband to the baseband (in the receivers $RX_1, \ldots, RX_M$), and $\eta$ is the receiver noise (which may include noise contributions by the uplink and transponder as well, as mentioned above). In this system, an uplink signal is obtained at the gateway by superposition of frequency-modulated multiple carriers carrying the symbols $u_1, \ldots, u_m, \ldots, u_M$. The functions $p_1, \ldots, p_m, \ldots, p_M$, indicate the pre-defined pulse shaping filters. Typically those are square root raised cosine filters with a chosen roll-off. Subsequent to pulse shaping, the ith carriers is modulated to appropriate frequencies using the function $f_i$. The uplink signal is then obtained by superposition of the outputs of $f_1, \ldots, f_m, \ldots, f_M$. Instead of having one satellite transponder serving one carrier, the transponder is shared by multiple carriers which implies, amongst others, joint filtering in an IMUX, joint amplification in a HPA, and joint filtering in an OMUX. The downlink signal is corrupted by receiver noise η and is received at receivers $RX_1$, ..., $RX_m$, ..., $RX_M$. Here, $RX_m$ receives the carrier "m", and performs frequency conversion using the function $f_m$. The downconverted stream is then filtered using the pulse shaping filter $p_m$.

Figure 8:
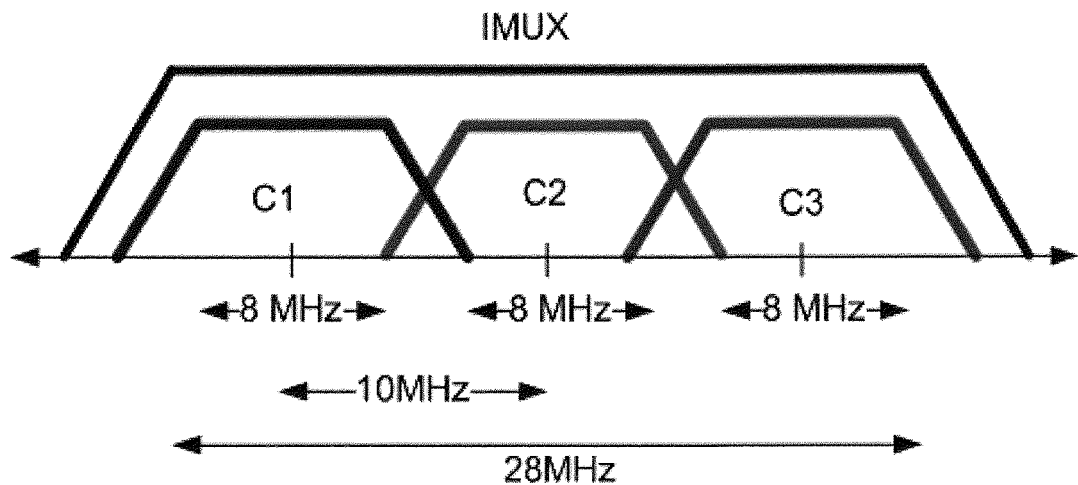

FIG. 8 illustrates, in a multiple carrier transmission scenario, the position of the carriers (labelled "C1", "C2" and "C3") with regards to the on-board IMUX/OMUX frequency response (labelled "IMUX"), wherein the same IMUX/OMUX filter as for FIG. 3 is used.

Figure 9A:
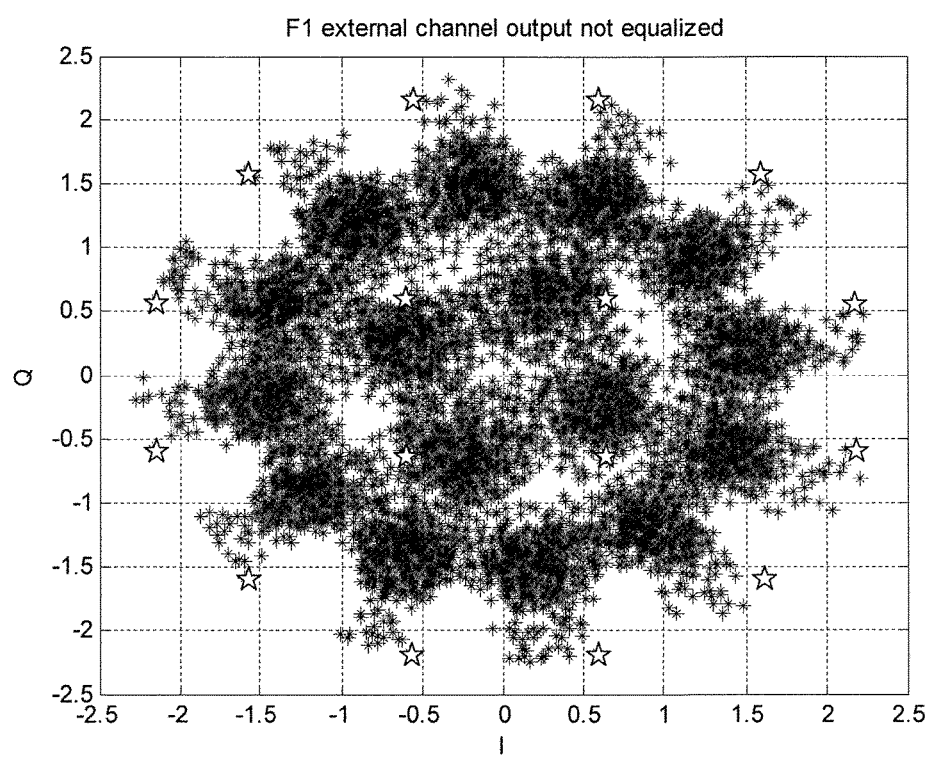
Figure 9B:
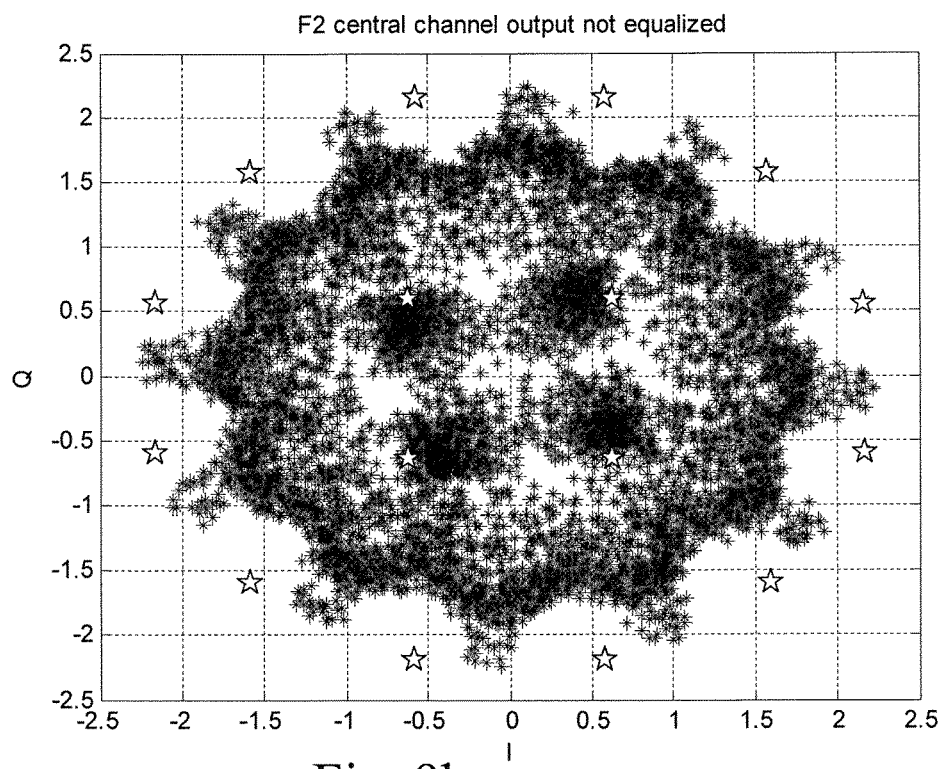
Figure 9C:
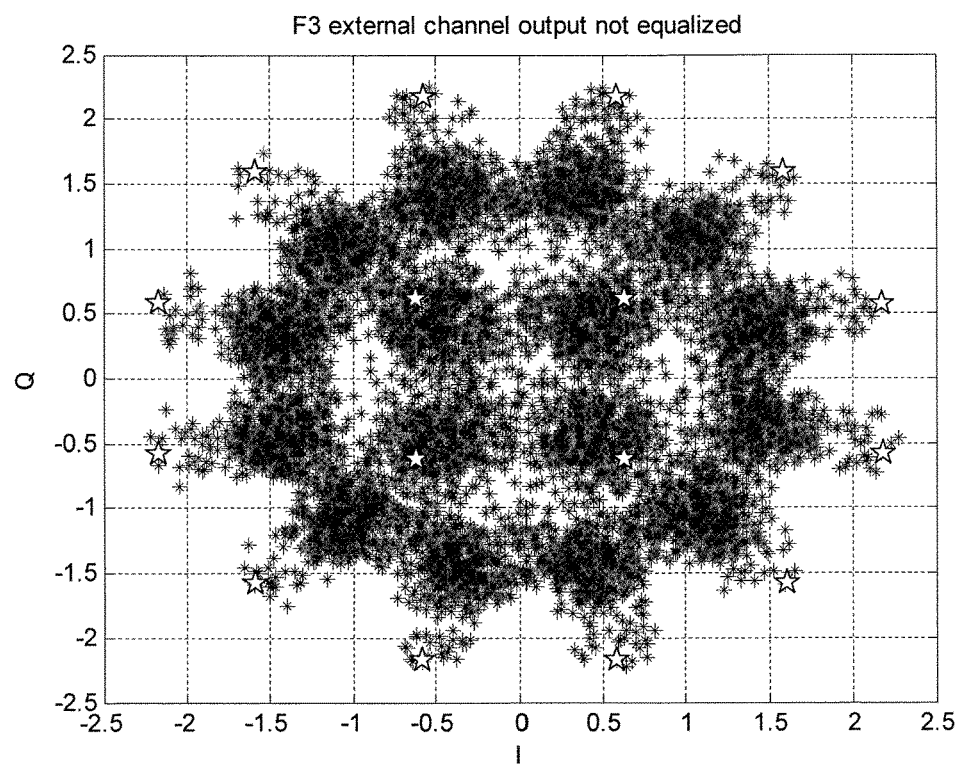

FIGS. 9a, 9b and 9c represent, respectively for carriers C1, C2 and C3, the collected received symbols after transmitting about 10000 symbols from 16 APSK constellations. The five-pointed star symbols in FIGS. 9a, 9b and 9c correspond to the original transmitted symbols, whereas the smaller, eight-pointed asterisks represent the received symbols, after distortion caused by the satellite channel. In addition to the effects seen in FIG. 4, the plots in FIGS. 9a, 9b and 9c show an increased distortion level arising from the ACI caused by multiple carriers. The non-linearity creates a spillover of the frequency content beyond the nominal bandwidth, causing interference to other carriers. Such effect was not present in single carrier. The effect of ACI is more pronounced for the central carrier (FIG. 9b) than for the external ones (FIGS. 9a and 9c).

The scenario illustrated by FIG. 7 involves a gateway transmitting, on the uplink channel to the satellite, many carriers that are amplified by a single HPA on board the satellite. In an exemplary implementation of this scenario, each carrier is a DVB-S2 waveform in the $K_a$ band. For example, each carrier may represent a television channel. In direct-to-home (DTH) services, the end users are generally integrated receiver decoders (IRD). Typically, these receivers decode only a particular carrier: this stems from complexity considerations and access restrictions. In the short-to-medium term perspective, an attractive strategy is the continued use of such receivers capable of decoding single carrier. Further, as will be detailed later, effective compensation techniques need to process the carriers jointly. These warrant that bulk of the mitigation takes place at the gateway.

Figure 10A:
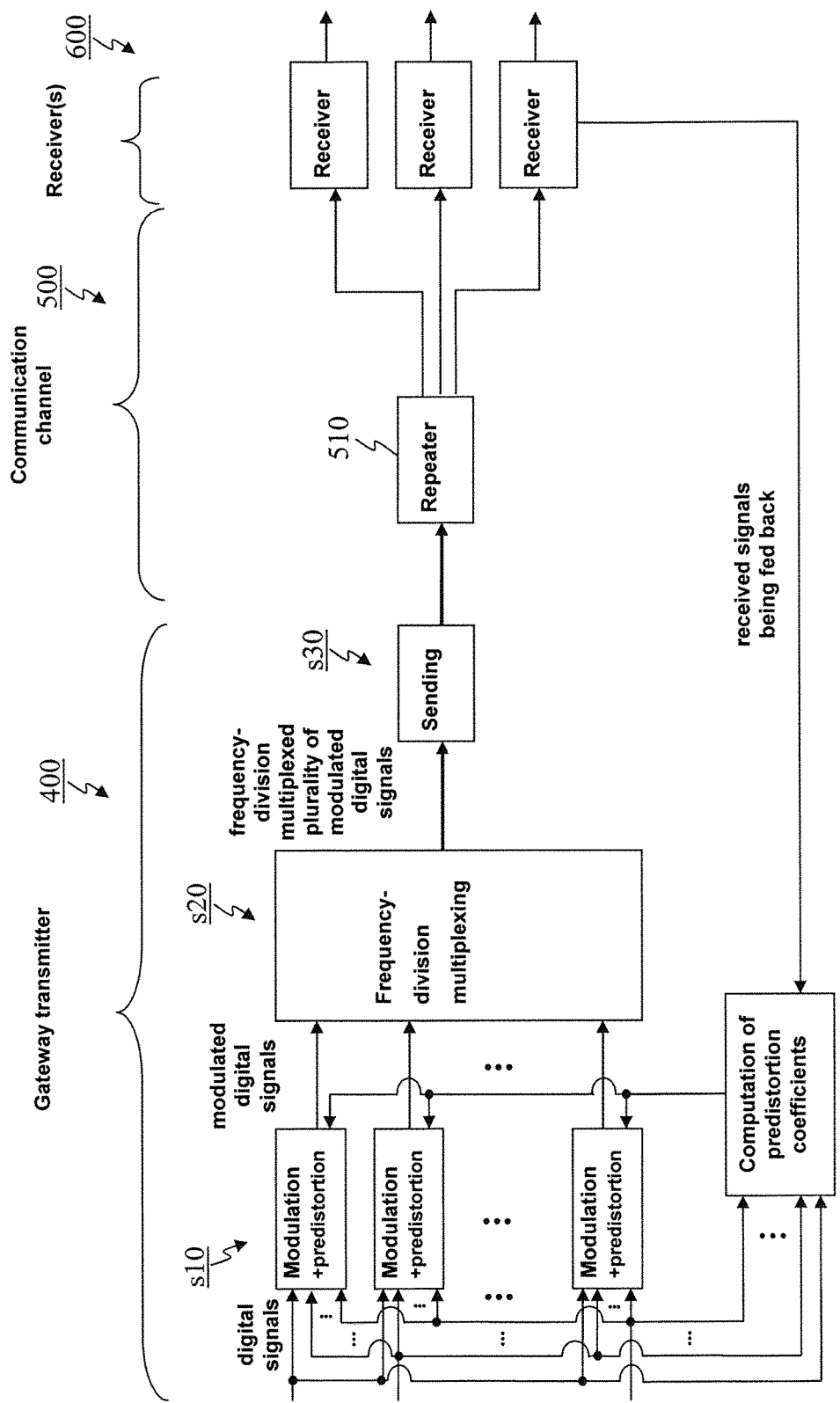
FIG. 10a schematically illustrates a method, and system, in one embodiment of the invention, where pre-distortion is performed upon modulating the digital signals.

FIG. 10a schematically illustrates a method (and system) in one embodiment of the invention, in which the pre-distortion is performed when modulating the signals.

The method is carried out by a gateway transmitter 400 for compensating, at least partially, the nonlinearities of a communication channel 500. The term "gateway" is used as the transmitter constitutes an entry point to communication channel 500.

Communication channel 500 comprises at least one repeater 510. In other words, at least one intermediate repeating device or communication relay is arranged on communication channel 500. The repeater(s) 510 may for example comprise a transponder on board a satellite (not illustrated in FIG. 10a) receiving signals from a gateway transmitter 400 on earth. Such a transponder may notably comprise an IMUX filter, an amplifier (such as for example a HPA) and/or an OMUX filter. Such a transponder may be a wideband transponder (e.g., 500 MHz) enabling multicarrier processing.

Figure 10B:
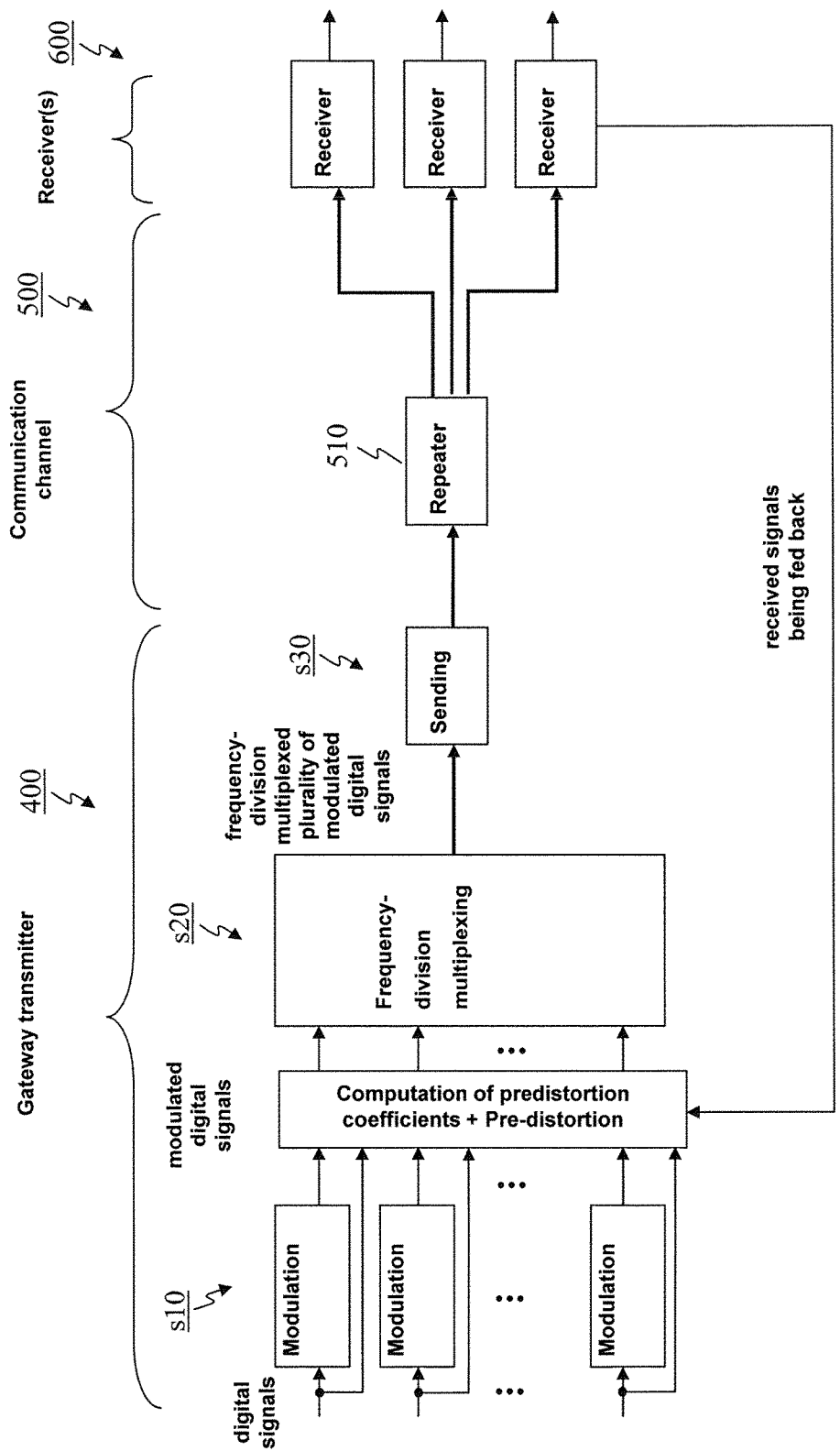
FIG. 10b schematically illustrates a method, and system, in one embodiment of the invention, where pre-distortion is performed after modulating the digital signals.

In one particular embodiment, communication channel 500 comprises one single repeater 510 (as illustrated in FIGS. 10a and 10b), which may be, for example, a satellite transponder. In another particular embodiment (not illustrated in the drawings), more than one repeater are arranged on the communication channel 500.

The repeater(s) 510 may be other types of communication relay(s), such as microwave repeaters on earth. The invention is not only applicable to satellite communication systems, and may be used in other systems such as microwave communication systems or optical fiber communication systems. The repeater(s) 510 is/are not collocated with gateway transmitter 400, but remotely located away from gateway transmitter 400 to extend the communication for a longer distance, and/or to avoid an obstacle. To do so, repeater(s) 510 receive(s) the communication signals and output(s) corresponding amplified ones. In that sense, the repeater(s) may therefore be regarded as remote repeater(s), i.e. remote from the gateway transmitter 400.

The method comprises modulating s10 a plurality of digital signals on a plurality of carriers respectively. Upon modulating s10, the symbols of the constellation diagram used for modulation of each carrier are distorted in accordance with a pre-distortion function. This symbol-level distortion is intentional and aims at alleviating the adverse effects of the non-linearity of communication channel 500 on the signals, so as to ultimately increase the gain (in spectral efficiency and/or power) of the communication system. The digital signals may for example be, but not limited to, TV broadcast signals. The symbol rate, i.e. the rate at which symbols are outputted by the modulation, and the bit rate, i.e. the arrival rate of the sequence of bits at the input of the modulation (symbol rate X number of bits per symbol), may be selected based on various conditions. The invention is not limited by the symbol rate and bit rate.

The plurality of carriers referred to in modulation step s10 may be baseband representation of the carriers—i.e. before any frequency translation to intermediate frequency (IF) or radio frequency (RF).

The modulation scheme(s) used in step s10 may comprise, but is not limited to, at least one of QPSK, BPSK, 8PSK, 16APSK, 32APSK, 64APSK, 128APSK and 256APSK. An exemplary modulator that may be used for step s10 is the Newtec M6100 Broadcast Satellite Modulator (see http://www.newtec.eu/product/m6100-broadcast-satellite-modulator consulted on Jun. 7, 2014).

The plurality of modulated digital signals are then frequency-division multiplexed s20. This occurs after modulating s10 and pre-distortion. For example, multiplexing s20 may be performed by frequency shifting each of the modulated signals and then adding the frequency-shifted signals (see in that respect FIG. 11, for example). Multiplexing may for example be performed in the baseband.

Still with reference to FIG. 10a, the plurality of modulated digital signals, after having been subject to frequency division multiplexing s20, are sent s30 for transmission (using for example an amplifier and, for a radio interface, an antenna or antenna array), through communication channel 500, to at least one receiver 600. There may be one receiver 600 (one-to-one communication) or a plurality of receivers 600 (one-to-many communication). In the multicarrier system, normal receivers (i.e., except for dedicated receivers as discussed below) are typically designed for single carrier operation only, disregarding all but one carrier.

The above-mentioned pre-distortion function involves a plurality of polynomial functions. Each of the polynomial functions takes as input the symbols from all the carriers. The polynomial functions' coefficients are here referred to as "pre-distortion coefficients". In other words, the pre-distortion applied to each carrier is respectively based on one or more polynomial function taking as input all carrier symbols (as schematically illustrated by the arrows reaching, on its left side, the box labelled "Computation of predistortion coefficients" in FIG. 10a), the set of coefficients of all the polynomial functions being the pre-distortion coefficients. The polynomial functions may be a weighted sum of certain products of the inputs (the symbols from the different carriers), so that the pre-distortion function is a non-linear function of the inputs. The weights are the pre-distortion coefficients.

The polynomial functions take as input the symbols drawn from the complex representation of values in the constellation diagram being used for modulation. If, for example, 16 values can be represented in the constellation diagram, 4 bits are chosen at a time leading to 16 possible values; each value is mapped to a constellation point in the complex plane. The mapping of the values to the constellation points is defined by the operator since the same mapping is needed at the receiver, and the pre-distortion function uses these symbols.

The pre-distortion function and the pre-distortion coefficients used at one point in time in the function form a pre-distorter model aimed at inverting the channel model, which represents the nature of the channel non-linearity.

The plurality of polynomial functions may be such that, for each carrier, only one of the polynomial functions is used for distorting symbols of the constellation diagram used for modulation of that carrier. In other words, in such case, the pre-distortion function involves polynomial functions and each of the polynomial functions generates pre-distorted symbols applicable to one carrier. In such case, each carrier has its own pre-distortion coefficients (so that the pre-distortion parameters can vary across carriers). In one implementation, the pre-distortion function, which takes as input symbols from all carriers, may be mathematically defined as $f(x)$, i.e. $f(x)$ is the pre-distortion function taking symbols from all carriers. Then, $f(x)=[f_1(x), f_2(x), \ldots f_M(x)]$ where $f_i(x)$ is the polynomial function for carrier "i" taking input from all carriers. Each $f_i(x)$ is a polynomial function in all the carriers' symbols, whereas $f(x)$ is a collection of these functions and may be, for example, a "vector" function, i.e. a vector of polynomial functions. In other words, in this implementation, the pre-distortion coefficients of all the carriers may be stacked into a large vector, this vector being obtained by a joint computation. Once the vector is obtained, the pre-distortion coefficients applicable to a particular carrier "i" are read off from the appropriate positions. For example, the first carrier may have its pre-distortion coefficients in the first L places, the next carrier in the next L positions and so on.

The invention, however, is not limited to the case of one polynomial function per carrier. Two or more polynomial functions may for example be used for one carrier, or one polynomial function may be used for more than one carrier.

The pre-distortion coefficients may be complex coefficients (some coefficients could have only real parts, some only imaginary, and other both). Baseband processing entails complex coefficients.

The pre-distortion coefficients are computed—i.e. estimated—in accordance with a direct learning approach.

Let us assume that $f(x)$ represents the channel and $x$ the input signal. Then, in a direct learning method, the aim is to estimate $f^{inverse}( )$ so that $f(f^{inverse}(x))$ is as close to $x$ as possible. In contrast, in an indirect learning method, the aim is to estimate $f^{inverse}( )$ so that $f^{inverse}(f(x))$ is as close to $x$ as possible. In the indirect learning method, the coefficients are computed during the learning phase as if they would be used for post-compensation at the receiver (indeed the channel function $f(x)$ is applied first, then the inverse function $f^{inverse}( )$). The indirect learning method is sensitive to the receiver noise. The direct learning method is more advantageous. An indirect learning method is based on the assumption that compensating before the non-linearity channel has the same effects as compensating after the non-linearity channel. This assumption is not valid in the presence of receiver noise, and making this assumption may lead to a poor performance.

Direct learning, compared to indirect learning, is for example discussed in D. Zhou and V. E. DeBrunner, "Novel adaptive nonlinear predistorters based on the direct learning algorithm," Signal Processing, IEEE Transactions on, vol. 55, no. 1, pp. 120-133, January 2007 (which notably shows that pre-compensation and post-compensation are not identical for single carrier cases), and in M. Abi Hussein, V. A. Bohara, and O. Venard, "On the system level convergence of ILA and DLA for digital predistortion," in Wireless Communication Systems (ISWCS), 2012 International Symposium on, August 2012, pp. 870-874.

The direct learning approach may for example employ, but is not limited to, a recursive least squares (RLS) filter or a least mean squares (LMS) filter. Variants of LMS and RLS may be contemplated as well.

The computation of the pre-distortion coefficients is performed jointly for the plurality of carriers, rather than performing a monocarrier pre-distortion applied independently to each carrier. A joint computation of the pre-distortion coefficients does not necessarily imply a joint use of the pre-distortion coefficients, as discussed above. The joint computation enables to generate terms that can be used to minimize the interference between carriers of the multicarrier signal.

The computation of the pre-distortion coefficients comprises iteratively updating the pre-distortion coefficients based on received signals being fed back from at least one among the at least one receiver 600 to gateway transmitter 400. There may for example be a dedicated receiver 600 capable of providing the feedback, with a multitude of "normal" receivers 600 not providing any feedback. A dedicated receiver 600 may optionally have a larger antenna than "normal" receivers, thus enabling a better reception (lower noise). A dedicated receiver 600 may also optionally be capable of detecting multiple carrier signals, whereas "normal" receivers are typically designed for single carrier operation.

In one particular embodiment, the dedicated receiver 600 is located at gateway transmitter 400, thus easing the feedback implementation. The invention is, however, not limited by the type of feedback means being used. Any means and/or channel(s) may be used to feed the received signals from any number of receivers 600 back to gateway transmitter 400. The feedback may for example be through the communication channel 500 but in the other direction (i.e. towards gateway transmitter 400), or through any another channel, such as for example a terrestrial link (through e.g. optical fibers).

The pre-distortion coefficients are updated based on received signals being fed back to gateway transmitter 400. In particular, a copy of the received data symbols may for example be compared with the corresponding transmitted data symbols. The coefficients are changed in such a manner as to (i.e., in a direction so as to) minimize the differences between the transmitted signal and received signal. The pre-distortion coefficients are updated in the pre-distortion function for example after comparing the copy of the received digital signal and the corresponding digital signal that had been transmitted. The "comparison→minimization→coefficients-update" process is repeated to improve the pre-distortion coefficients.

The above-described embodiment, involving multi-carrier pre-distortion carried out before multiplexing (i.e. a data DPD technique, rather than a signal DPD technique) in conjunction with the use of a direct learning method for computing the pre-distortion coefficients, in a closed-loop, iterative process, provides a performance enhancement thanks to the increased robustness to receiver noise. In particular, the potentially significant nonlinearities induced by the existence, on communication channel 500, of the repeater(s) 510 (such as for example, but not limited to, a transponder on board a satellite), designed to handle (filtering, amplifying, etc.) multicarrier signals, make the use of the method particularly useful and justified. Insofar as the example of a repeater being a transponder on board a satellite is concerned, the interest is not only to compensate for the amplifier nonlinearities but also for those introduced by on-board filters. The pre-distortion measures undertaken at gateway transmitter 400 may be used to jointly compensate for these various nonlinearities.

FIG. 10b schematically illustrates a method (and system) in one embodiment of the invention, which differs from the method (and system) of FIG. 10a in that the pre-distortion is performed after modulating the digital signals (i.e., the predistorter is located after the modulator in the processing chain). In general, the modulation may therefore be followed by the pre-distortion (FIG. 10b) or the pre-distortion may occur when modulating (FIG. 10a). Both embodiments provide similar advantages.

In one embodiment, before received fed back signals are available, the pre-distortion coefficients are set as if communication channel 500 had a linear gain with the gain factor being unity. This provides for a simple initialization process.

In one embodiment, before received fed back signals are available, the pre-distortion coefficients are set based on channel model parameters obtained in advance through at least one of tests, simulations and studies carried out on, or regarding, communication channel 500 and/or at least one among the at least one repeater 510. This enables to provide initial values for setting up the method. For example, if the repeater is a satellite transponder, tests, simulations and/or studies may be carried out on earth on the satellite transponder without the need for actually testing the complete communication channel. The initial values may be based on information provided by the manufacturer regarding the satellite transponder. There are a number of ways according to which a channel model may be obtained to eventually derive suitable initial values.

In one embodiment, the input digital signals (i.e., the signals being subject to modulation) are originally in the form of packets. Each of the packets is assigned a packet identifier, and they are stored, i.e. buffered, in gateway transmitter 400 together with their packet identifiers, after having been transmitted. The received fed back signals are also in the form of packets or rearranged, by gateway transmitter 400, in the form of packets. If the receiver—from which the feedback originates—is collocated with gateway transmitter 400, the transmission of the feedback signal may for example occur on a bus. In such a case, subjecting the signals to modulation for feedback may be unnecessary. The computation of the pre-distortion coefficients involves comparing the contents of the received fed back signals' packets with the contents of the buffered packets to estimate the error rate caused by the communication channel 500. The use of packet identifiers will be further described notably with reference to FIG. 19a.

The use of packet identifiers is, however, not essential. Other mechanisms may be used instead, such as a delay mechanism (see for example WO 2006/031156, FIG. 2, "delay" 6). Using packet identifiers is a simple mechanism to obtain the required information to compute the pre-distortion coefficients.

In one embodiment, fed back information on the received signals on all active carriers is required for triggering the process of computing the pre-distortion coefficients.

Figure 11:
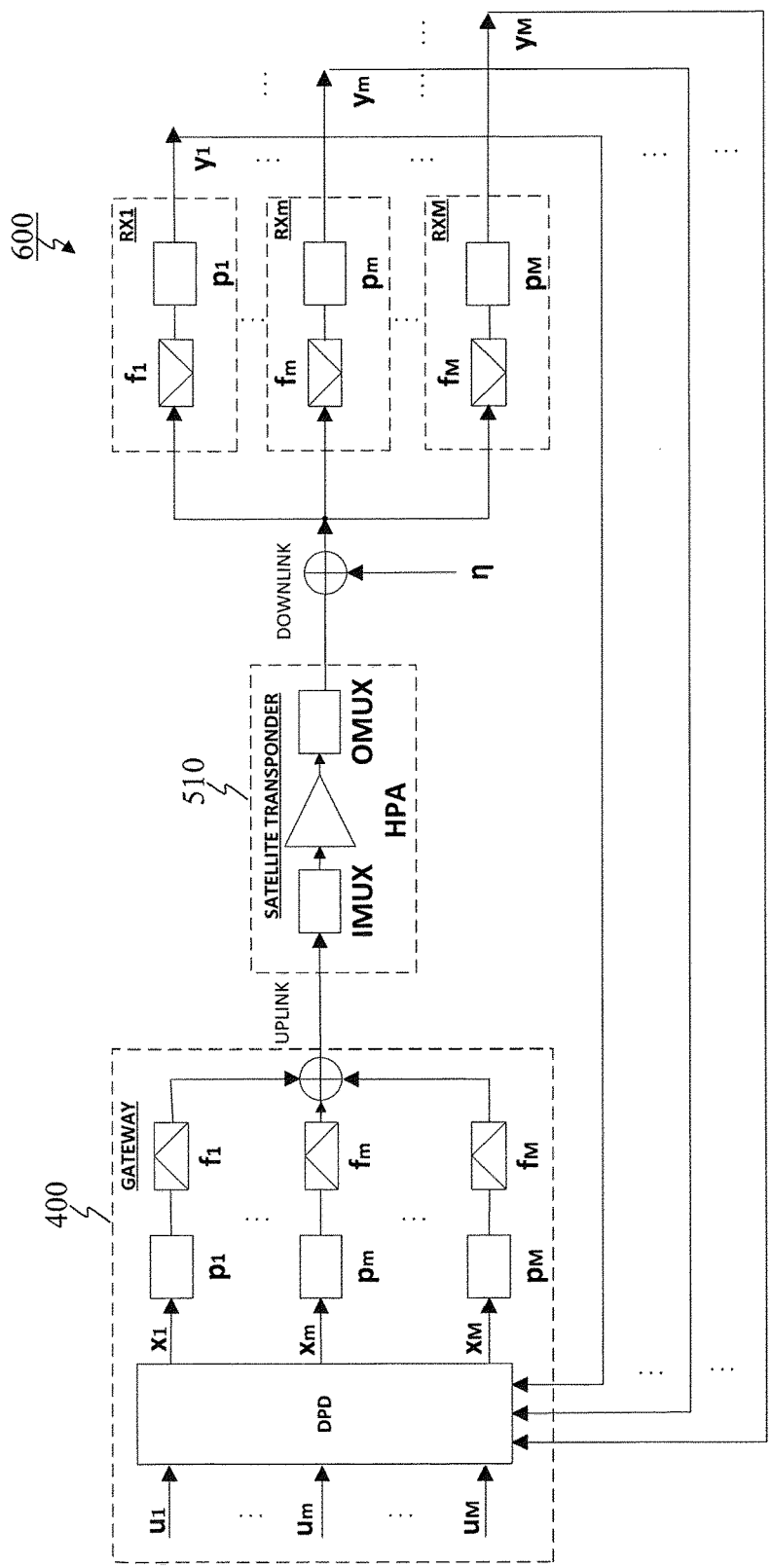
FIG. 11 schematically illustrates a method, and system, in one embodiment of the invention.

Let us now turn to FIG. 11 schematically illustrating a method and system in one embodiment of the invention. The architecture of FIG. 11 is similar to that of FIG. 7, except that data DPD is applied across all incoming symbols $u_1 \ldots u_m \ldots u_M$ on the carriers. Data on the predistorted carriers $x_1 \ldots x_m \ldots x_M$ are pulse shaped by functions $p_1 \ldots p_m \ldots p_M$ respectively, and then frequency translated by $f_1 \ldots f_m \ldots f_M$ (respectively) before being superposed and uplinked. The receiver outputs $y_1, \ldots y_m, \ldots y_M$ are fed back to the DPD at gateway transmitter 400.

The pre-distortion function may operate in real-time at gateway transmitter 400. Sporadic feedback instances are provided by one or more receivers 600 to update the pre-distortion coefficients of the pre-distortion function.

Figure 12:
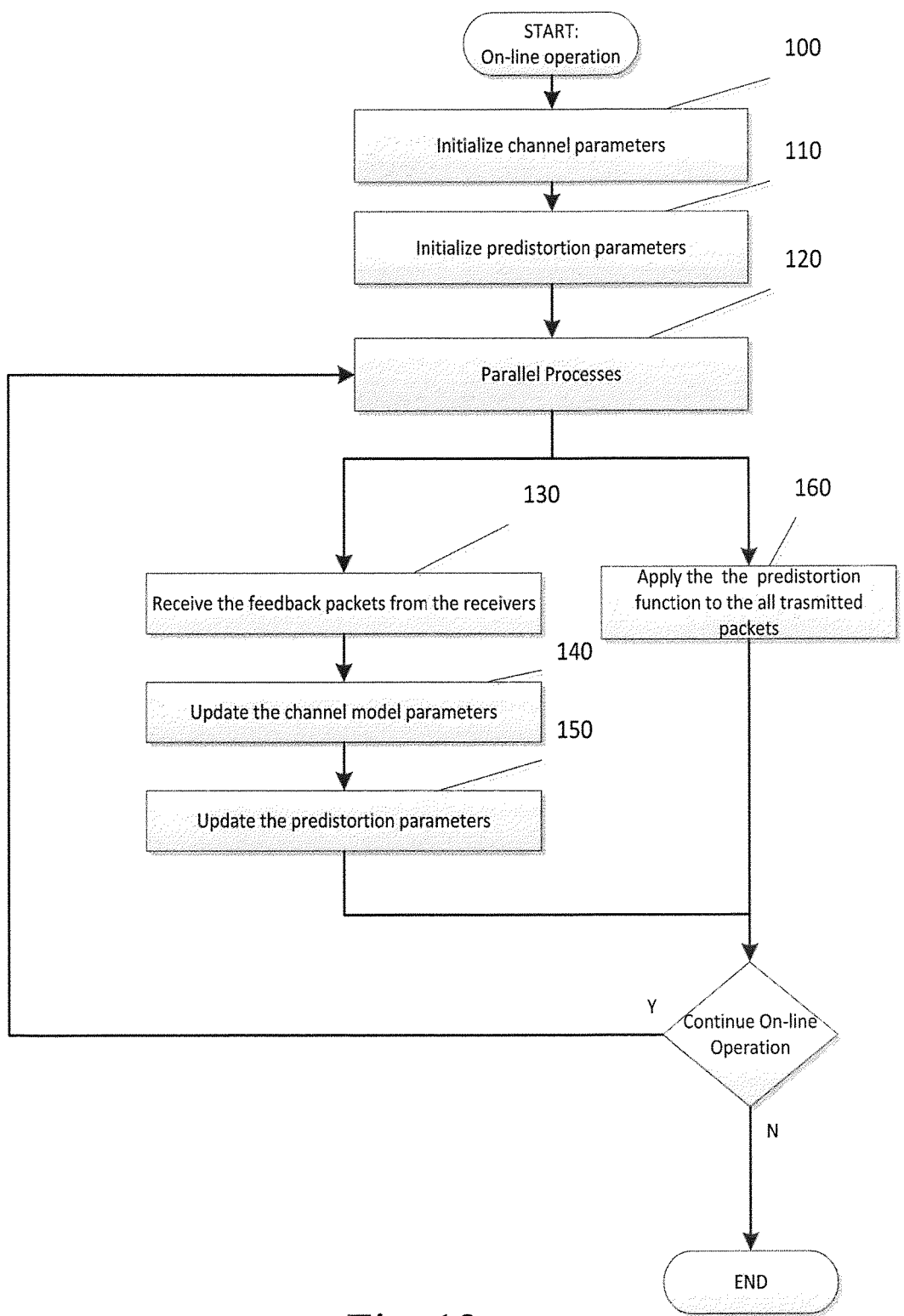
FIG. 12 is a flow chart of a method in one embodiment of the invention.

FIG. 12 is a flow diagram of a method in one embodiment of the invention, which can be described as follows:

Step 100: The channel parameters vector is initialized to the identity (channel with unitary gain).

Step 110: The predistorter parameters (i.e., the pre-distortion coefficients) are initialized to the identity function (a function with unitary gain).

Step 120: Two processes may be created that may run in parallel and independently from each other. The first one serves to estimate in the background the predistorted parameters (i.e., the pre-distortion coefficients). The second one is for the normal on-line operation of the gateway transmitter (i.e., the operation of handling the traffic by the gateway transmitter).

Step 130: This process is idle waiting to receive back the feedback packets from the receiver(s). Packets may be provided with a unique ID by the gateway transmitter so as to allow retrieving the previously stored original transmitted packet, once the feedback packets are received with their ID. Once a time-coherent set of packets is recovered for all carriers, the process proceeds to the next step.

Step 140: The set of received and transmitted packets from all carriers is used to update the estimate of the channel model parameters that is used for the subsequent pre-distortion parameters estimation (step 150). An exemplary implementation of step 140 is illustrated in FIG. 13.

Figure 14:
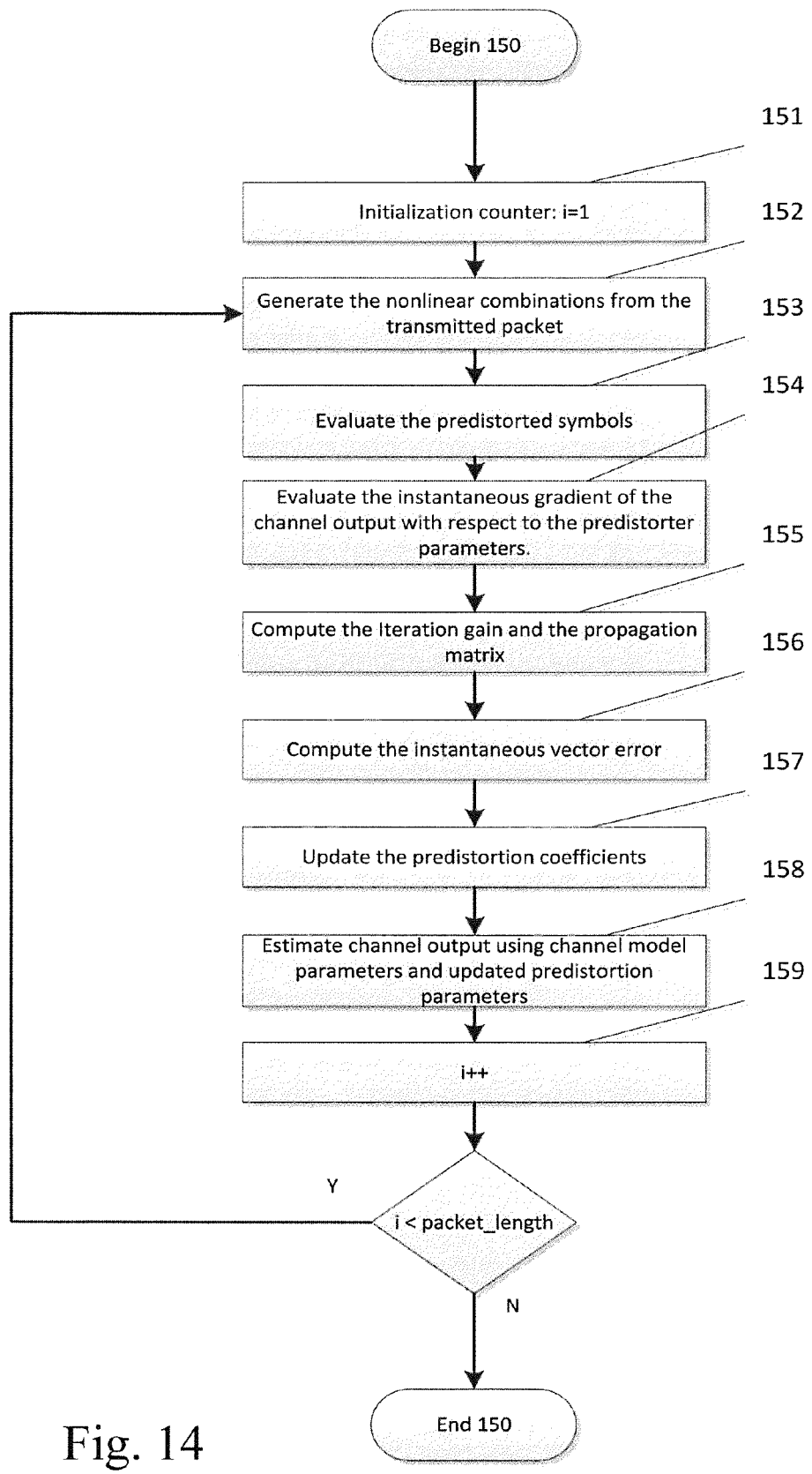

Step 150: An iterative numerical method is used to update the estimated predistorter parameters (i.e., the pre-distortion coefficients) using the provided set of data corresponding to the transmitted and received packets, and the channel model parameters. An exemplary implementation of step 150 is illustrated in FIG. 14.

Step 160: According to the normal on-line operation, the transmitter applies the pre-distortion function to all the incoming packets to be uplinked. Symbols and packets from different carriers are transmitted synchronously. All carriers have the same baud rate.

Figure 13:
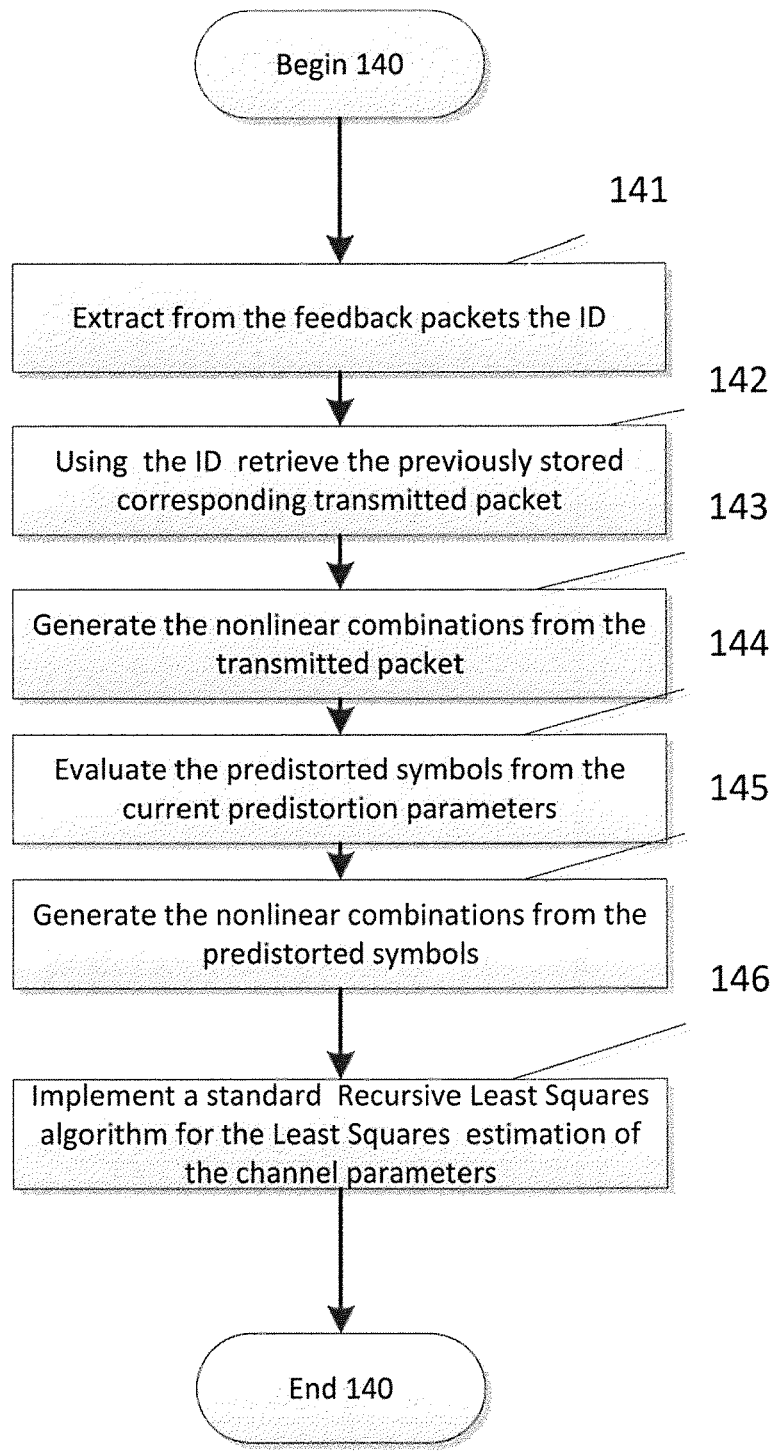
FIGS. 13 and 14 are flow charts of portions of the method illustrated in FIG. 12.

FIG. 13 is a flow diagram of step 140 as described with reference to FIG. 12, in one embodiment of the invention. The flow diagram can be described as follows:

Step 141: Given the received packets from a time coherent window, the packet ID is extracted.

Step 142: Using the packet ID, the corresponding originally transmitted packets are fetched.

Step 143: Considering the transmitted symbols, the non-linear combinations $\Phi(u_{[0-P]}(n))$ are generated, where $u_{[0-P]}(n)$ is a vector collecting the transmitted symbols from all the carriers $u_1 \ldots u_m \ldots u_M$ from the (n-P)th to the nth time instance, where P is the model memory depth and M is the number of carriers. The function $\Phi(\cdot)$ takes this input vector and generates from its elements a column vector of polynomial terms.

Step 144: Using the generated nonlinear combinations and the current predistorter parameters estimate w (i.e., the current pre-distortion coefficients), the corresponding predistorted symbols x are evaluated:

$$x(n) = \sum_{k=0}^{P} \sum_{\Delta f} W_k^{(1)} u_k(n) + W_{k,\Delta f}^{(3)} e^{j2\pi\Delta f n} u_k(n) \times u_k(n) \times u_k(n)^*$$

where:

$W_k^{(r)}$ is the matrix incorporating the rth degree predistorter coefficients relative to the n-kth input symbols, $\Delta f$ is the frequency spacing, * is the complex conjugate operator $x(n)=[x_1(n), \ldots ,x_M(n)]^T$ $u_k(n)=[u_1(n-k), \ldots ,u_M(n-k)]^T$ $x_i(n)$: nth predistorted symbol in the i-th carrier
$u_i(n)$: nth data symbol in the i-th carrier
The pre-distortion function can be rewritten as a single linear operation in the unknown coefficient column vector w $x(n)=\Phi(u_{[0-P]}(n))w$ or simply $x(n)=\Phi(n)w$ where $u_{[0-P]}(n)=[u_0(n), \ldots , u_P(n)]^T$
Note that $x_k(n)=\Phi(n-k)w$ Step 145: Once the predistorted symbols are obtained, the non-linear combinations of the predistorter symbols x are obtained as $\Psi(x_{[0-P]}(n))$, where $x_{[0-P]}(n)$ is a vector collecting the predistorted symbols from all the carriers $x_1 \ldots x_m \ldots x_M$ from the n-Pth to the nth time instance. The function $\Psi(\cdot)$, similarly to $\Phi(\cdot)$, takes this input vector and generates the polynomial terms.

Step 146: Using a RLS adaptive filter, the channel parameters vector minimizing the two-norm cost function defined as $\|y-\Psi(x_{[0-P]}(n))h\|^2$ is obtained, where y is the collection of output symbols obtained from the feedback, and h is the channel parameters vector. Note here that $\|d\|^2$ of any vector d is the sum of squares of amplitudes of all the entries (two-norm).

FIG. 14 is a flow diagram of step 150 as described with reference to FIG. 12, in one embodiment of the invention. The flow diagram can be described as follows:

Step 151: A counter to access every symbols of the received packets is initialized to 1.

Step 152: Given the transmitted symbols, the non-linear combinations $\Phi(u_{[0-P]}(n))$ are generated.

Step 153: Using the generated nonlinear combinations and the current predistorter parameters estimate w (i.e., the current pre-distortion coefficients), the corresponding predistorted symbols x are evaluated:

$$x(n) = \sum_{k=0}^{P} \sum_{\Delta f} W_k^{1} u_k(n) + W_{k,\Delta f}^{3} e^{j2\pi\Delta f n} u_k(n) \times u_k(n) \times u_k(n)^*$$

where:

$x(n) = [x_1(n), \ldots , x_M(n)]^T$ $u_k(n) = [u_1(n-k), \ldots , u_m(n-k)]^T$ $x_i(n)$: nth predistorted symbol in the i-th carrier
$u_i(n)$: nth data symbol in the i-th carrier
The pre-distortion function can be rewritten as a single linear operation in an unknown coefficient column vector w $x(n)=\Phi(u_{[0-P]}(n))w$ or simply $x(n)=\Phi(n)w$ where $u_{[0-P]}(n)=[u_0(n), \ldots , u_P(n)]^T$
Note that $x_k(n)=\Phi(n-k)w$ Step 154: Using the channel parameters $H^{1,3}$, where $H^{(r)}$ is the matrix incorporating the rth degree predistorter coefficients extracted from the parameters vector h and $\Phi(n)$ being the nonlinear input combination vector, the channel output vector may be expressed as:

$$y(n) = \sum_{k=0}^{K} \sum_{\Delta f} H_k^1 \Phi(n-k)w +$$
$$H_{k,\Delta f}^3 e^{j2\pi\Delta f n} \Phi(n-k) \times \Phi(n-k) \times \Phi(n-k)^* w \times w \times w^*$$

From this expression, the channel output can be differentiated with respect to w, thus obtaining the gradient required for the optimization:

$$\frac{\partial y}{\partial w} = \sum_{k=0}^{K} \sum_{\Delta f} H_k^1 \Phi(n-k) +$$
$$H_{k,\Delta f}^3 e^{j2\pi\Delta f n} \Phi(n-k) \times \Phi(n-k) \times \Phi(n-k)^* (w \times I + I \times w) \times w^*$$

Step 155: Using the gradient matrix obtained in step 154, the iteration gain matrix K and propagation matrix P can be computed $$K(i) = P(i-1)\frac{\partial y}{\partial w}\left(I + \alpha^{-1}\frac{\partial y^H}{\partial w}P(i-1)\frac{\partial y}{\partial w}\right)^{-1}$$

$$P(i) = \alpha^{-1}(P(i-1) - K(i)\frac{\partial y^H}{\partial w}P(i-1)$$

where P(1)=I (identity matrix) and α is the forgetting factor (scalar).

Step 156: The instantaneous error vector measured on the received symbols of all carriers is computed: e(n)=u(i)−y(i)

Step 157: The predistorter coefficients, the error vector and the gain matrix are updated. The predistorter coefficients update equation is $w(i+1)=w(i)+\mu K(n)e(n)$ where μ is the step parameter governing the convergence property of the algorithm.

Step 158: Using the updated pre-distortion coefficients and the channel function, the received symbols are estimated.

$$y(n) = \sum_{k=0}^{K} \sum_{\Delta f} H_k^1 \Phi(n-k)w +$$
$$H_{k,\Delta f}^3 e^{j2\pi \Delta fn} \Phi(n-k) \times \Phi(n-k) \times \Phi(n-k)^* w \times w \times w^*$$

Step 159: The symbols counter i is increased.

In the following, the performance of a method according to one embodiment of the invention is discussed in a situation where a satellite HPA amplifies three carriers jointly. The performance is here evaluated as the relative loss, in decibels (dB), of the energy per symbol needed to achieve a target bit error rate of 0.00001. The loss is evaluated with respect to the case of an ideal HPA that does not introduce any nonlinearities (thus not requiring any pre-distortion).

FIGS. 15 to 18 illustrate the performance with respect to the amplifier efficiency for considered techniques: "Signal DPD" (N. Kelly et al, 2013, full reference provided above), "MC-DPD" (R. Piazza et al, "Multicarrier Digital Pre-distortion/Equalization Techniques for Non-linear Satellite Channels," Proc. of the 30th AIAA International Communications Satellite Systems Conference (ICSSC-2012), Ottawa, Canada, 24-27 Sep. 2012) and "Memoryless linear Equalization", i.e. a no-compensation case where a simple gain and phase control is used as an equalizer. The curves labelled "DPD Direct Estimation" and "DPD Direct Estimation+Improved Model" corresponds to two embodiments of the invention, respectively.

Some embodiments of the invention use the DPD direct estimation without the so-called "improved model", while other embodiments of the invention uses DPD direct estimation with the improved model. The use of the improved model is thus optional, with the direct estimation supporting various predistorter models. In particular, the improved model takes into account additional artefacts, which relate to the terms $e^{j2\pi\Delta fn}$ in the equations or, in other words, the out-of-band terms. The improved model is disclosed in B. F. Beidas, "Intermodulation Distortion in Multicarrier Satellite Systems: Analysis and Turbo Volterra Equalization," IEEE Trans. Commun., vol. 59, no. 6, pp. 1580-1590, June 2011, but was never used in combination with a direct learning approach for computing predistortion coefficients.

Figure 15:
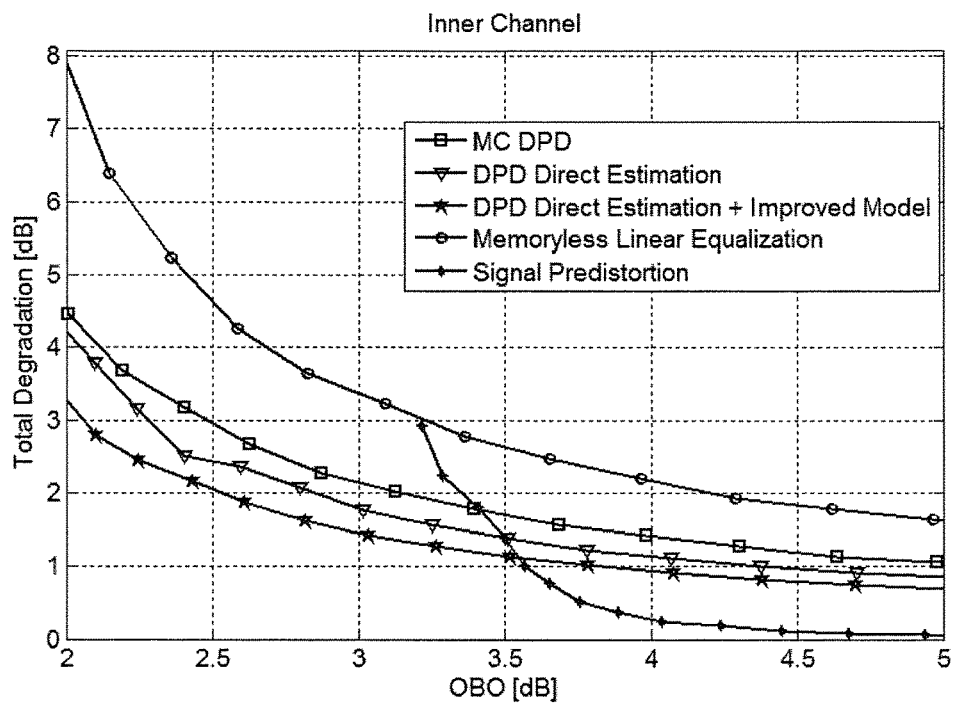
FIGS. 15 to 18 compare the performance of different techniques.
Figure 16:
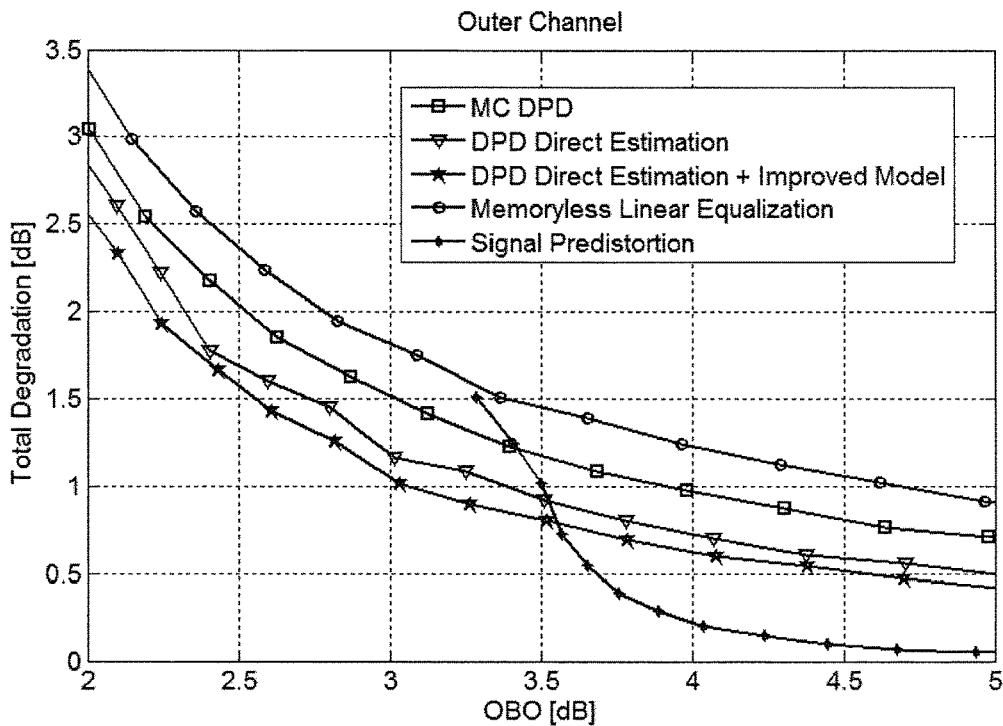
Figure 17:
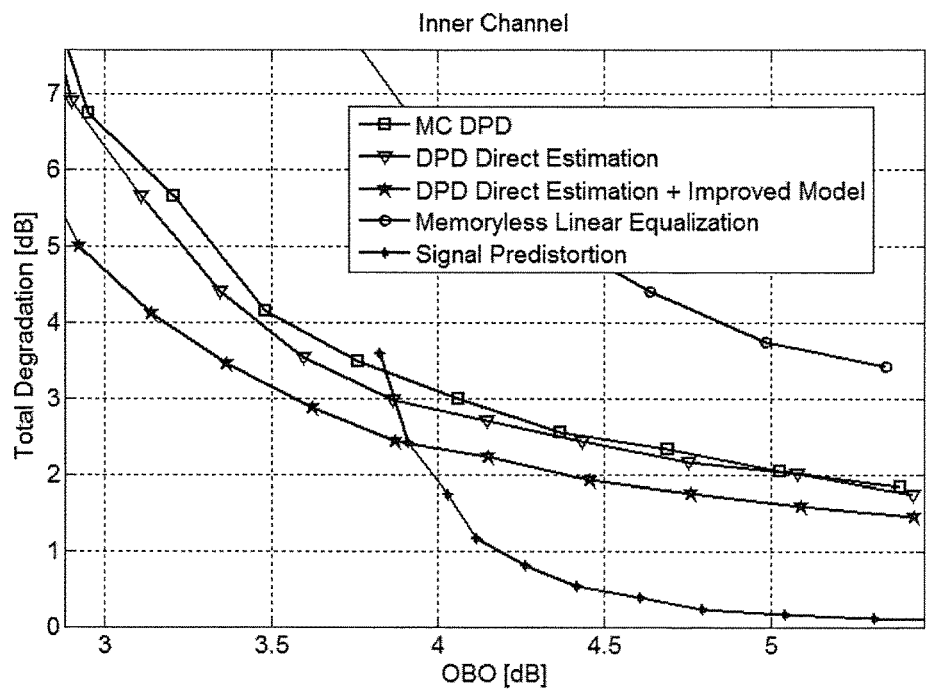
Figure 18:
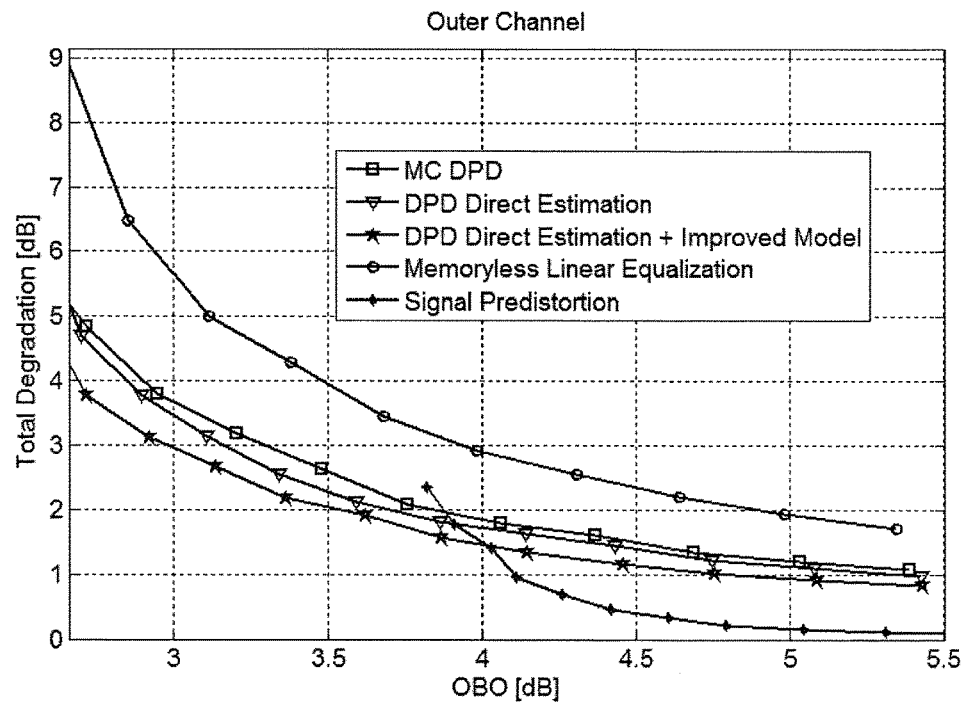

In particular, FIG. 15 shows a performance comparison for the central channel 16APSK 9/10; FIG. 16 shows a comparison for the external channel 16APSK 9/10; FIG. 17 shows a comparison for the central channel 32APSK 9/10; and FIG. 18 shows a comparison for the external channel 32APSK 9/10 (the notation "9/10" refers to the code rate, indicating that, for every 9 information bits, 10 bits are generated, with the extra bit providing redundancy). It can be observed that higher degradation happens in the central carrier due to the nature of non-linear adjacent channel interference.

Substantial gains, of around 0.5 to 0.75 dB for one embodiment of the invention without the application of the "improved" model (curve labelled "DPD Direct Estimation") and around 1 to 2 dB for one embodiment of the invention with the application of the "improved" model (curve labelled "DPD Direct Estimation+Improved Model"), are obtained over prior art DPD techniques, while signal predistortion provides, compared to data DPD, a slightly better performance for higher backoff regimes. However, signal DPD requires higher complexity processing for both on-line and off-line operations since it requires wideband processing. Indeed, the processing in data DPD occurs at the carrier level in the data domain, whereas, for the signal DPD, the processing occurs after multiplexing. The multiplexing increases the signal bandwidth and hence a higher speed processor is needed to handle the large bandwidth.

In one embodiment (not illustrated in the drawings), a method involves buffering packets at gateway transmitter 400, and using packet identifiers, to perform a comparison to eventually update the pre-distortion coefficients. The method, in this embodiment, comprises the following steps:

a) providing, at gateway transmitter 400, a channel model estimate; (The initial channel model estimate may be chosen as being identity: unity gain channel.)

b) receiving, at gateway transmitter 400, a plurality of digital signals to be transmitted (synchronously, in the sense that the transmitted symbols are time aligned) over communication channel 500;

c) pre-distorting, at gateway transmitter 400, the signal of each of the plurality of signal carriers—this step occurs during or after the above-discussed modulation step s10, but prior to the multiplexing step s20 and transmission s30 over the communication channel 500;

d) transmitting (synchronously), at gateway transmitter 400, each data packet to its assigned carrier;

e) receiving, at gateway transmitter 400, fed back packets over a feedback channel, wherein at least one feedback packet per carrier is received over the feedback channel;

f) updating the channel model estimate; (With the transmitted and received packets, gateway transmitter 400 may use an iterative approach to obtain the channel estimates. Upon reception of each packet, a conventional RLS method may be used to update the channel model estimate. The channel model estimate obtained from the previous estimate then serves as the initial estimate for the next update of the channel parameters estimation algorithm.)

g) updating the pre-distortion coefficients (Obtaining the pre-distortion coefficients w may involve an iterative process in which the current estimate of the parameter vector is updated to approach the solution of the optimization problem. The initial estimate for the iterative process may be the unity (no pre-distortion). This update process, also known as learning, takes place for a number of iterations);

h) applying the updated pre-distortion coefficients of the pre-distortion function to the packets to be transmitted; and i) determining whether learning/updating is completed, for example based on a threshold.

In one embodiment (illustrated by FIG. 19a), a method also involves buffering packets at gateway transmitter 400, and using packet identifiers, to perform a comparison to eventually update the pre-distortion coefficients. The method comprises the following steps, assuming that all carriers are active (i.e., the signal power of each of the carriers is larger than zero):

a) The basis of the communication is data packets.

b) Using the input data on a particular carrier, gateway transmitter 400 generates a packet for transmission on that carrier. The packet structure is predefined. Each data packet has a predefined number of symbols.

c) Apart from the information data part (i.e., containing information for end users), each packet has an identification field called "packet ID". Packets that are scheduled for transmission on different carriers at the same time have the same packet ID. Packets transmitted at different times have different IDs. The packet ID is incremented by one for every packet.
d) Gateway transmitter 400 buffers a number of packets of each carrier (denoted by N) in the DATA BUFFER; the number of packets buffered is at least as large as (or optionally twice) the product of the data packet transmission rate and the delay in receiving feedback. The buffer may be a first-in-first-out (FIFO) system.
e) Gateway transmitter 400 checks the packet ID across carriers and schedules those packets having the same packet ID for transmission.
f) Gateway transmitter 400 then applies the current pre-distorter model (i.e., the current pre-distortion coefficients) on the scheduled packets to distort their symbols. If the predistorter model has been updated, gateway transmitter 400 stores the packet ID of the first packet modified by the updated predistorter in the ID REGISTER. Gateway transmitter 400 may use two data storage elements:
   a. DATA BUFFER to store N packets of all the carriers, and
   b. ID REGISTER to store the packet ID of the packet that is first modified by the updated predistorter.
g) The receiver 600, upon receiving the packet, quantizes each of the symbols using a predefined number of bits. The number of bits is preferably large enough to provide a quantization error less than at least −30 dB.
h) Subsequent to the quantization, receiver 600 modulates the bit stream obtained by quantization using a predefined modulation. A robust scheme like QPSK may be used. Receiver 600 then creates a feedback packet with a start of frame indicator (a predefined pattern of symbols), followed by the modulated data. This is fed back to gateway transmitter 400 using some error free connection. Packets of different carriers are sent on different pre-defined channels (non-interfering) on this connection. The feedback packet is added to the transmitted packet, in addition to the "start of frame" indicator, as shown in FIG. 19*b*.
i) A single receiver 600 may receive packets of all the carriers. Alternatively, packets of different carriers may be received by different receivers 600 co-located or spatially separated. Each receiver 600 performs the operation in steps g) and h). Their location is at the discretion of the operator. While it is sufficient to have one such receiver 600 capable of decoding multiple carriers, multiple receivers 600 capable of decoding only single carriers may also be provided. Data from all the carriers and a connection for feeding back the data are needed. Typical user end receivers 600 cannot feedback the data. Dedicated receivers 600 are typically required.
j) There is a predefined delay associated with the communication from gateway transmitter 400 to receiver 600 and from receiver 600 back to gateway transmitter 400, and N packets will have been transmitted by then.
k) Upon receiving the packets on different carriers, gateway transmitter 400 decodes them, and determines the availability of packets from all carriers having the same ID and waits until such an event happens.
l) Once packets on all carriers with the same ID have been found, gateway transmitter 400 checks the packet ID with that in the ID REGISTER. If the packet ID is found to be equal than the entry in ID REGISTER, gateway transmitter 400 retrieves the corresponding packets (on all carriers, and they are indexed by the packet ID) from DATA BUFFER. If the packet ID is less than the entry in ID REGISTER, gateway transmitter 400 proceeds to step k).
m) With the transmitted and received packets, gateway transmitter 400 may use an iterative approach to obtain the channel model. The initial channel model estimate may be chosen as identity: unity gain channel. On reception of each packet, a conventional RLS technique may for example be used to update the channel model estimate. The channel model estimate obtained from the previous estimate then serves as the initial estimate for the next update of the channel parameters algorithm. Alternatively to this dynamic estimation mechanism, channel model parameters may be obtained offline using data from the transponder manufacturer or on-ground transponder test before launch.
n) The pre-distortion parameter estimate—i.e. the pre-distortion coefficients w—is updated as follows: The predistorter implements the function $x(n)=\phi(n)w$ where $\Phi(u(n))$ is a non-linear function taking the present and some past inputs of all the carriers and w is the predistorter parameter vector. Obtaining the predistorter parameters w involves solving a computationally intensive optimization problem. Thus, an iterative process is considered where the current estimate of the parameter vector is updated to approach the solution of the optimization problem. The initial estimate for the iterative process may be unity (no predistorter). This update process, known as direct learning (as explained above), is repeated for a number of iterations.
o) The number of iterations for determining the predistorter coefficients is selected based on comparing the improvement in the signal quality over the previous iteration with a threshold. The signal quality is determined by comparing the fed back signal with the corresponding transmitted signal using a predefined algorithm, and the threshold may be set at the beginning of the operations. If the threshold is exceeded, then the iterations stop. Otherwise, gateway transmitter 400 proceeds to step a). The update process of the channel model and the pre-distortion coefficients is known as learning process. The duration of the process is predefined to be either a continuous process or terminate after the improvement in signal quality across iterations falls below a predefined threshold.

FIG. 20 is a schematic diagram of an exemplary implementation of a computer 300 that may be used in embodiments of the invention, for example for computing the pre-distortion coefficients, for computation of the channel model (if any), for generation of the packets (if used), for modulation, and/or for generating the predistorted stream. A gateway transmitter 400 and/or a dedicated receiver 600 may involve such a computer 300, as schematically illustrated in FIG. 20. As illustrated, computer 300 may include a bus 305, a processing unit 303, a main memory 307, a ROM 308, a storage device 309, an input device 302, an output device 304, and a communication interface 306. Bus 305 may include a path that permits communication among the components of computer 300.

Processing unit 303 may include a processor, a microprocessor, or processing logic that may interpret and execute instructions. Main memory 307 may include a RAM or another type of dynamic storage device that may store information and instructions for execution by processing unit 303. ROM 308 may include a ROM device or another type of static storage device that may store static information and instructions for use by processing unit 303. Storage device 309 may include a magnetic and/or optical recording medium and its corresponding drive.

Input device 302 may include a mechanism that permits an operator to input information to computer 300, such as a keypad, a keyboard, a mouse, a pen, voice recognition and/or biometric mechanisms, etc., and/or a mechanism that receives input for example from an antenna followed by an analog-to-digital converter. Output device 304 may include a mechanism that outputs information to the operator, including a display, a printer, a speaker, etc., and/or a mechanism that provides output for example to a digital-to-analog converter for frequency translation. Communication interface 306 may include any transceiver-like mechanism that enables computer 300 to communicate with other devices and/or systems. For example, communication interface 306 may include mechanisms for communicating with another device or system via a network.

Computer 300 may perform certain operations or processes described herein. These operations may be performed in response to processing unit 303 executing software instructions contained in a computer-readable medium, such as main memory 307, ROM 308, and/or storage device 309. A computer-readable medium may be defined as a physical or a logical memory device. For example, a logical memory device may include memory space within a single physical memory device or distributed across multiple physical memory devices. Each of main memory 307, ROM 308 and storage device 309 may include computer-readable media. The magnetic and/or optical recording media (e.g., readable CDs or DVDs) of storage device 309 may also include computer-readable media. The software instructions may be read into main memory 307 from another computer-readable medium, such as storage device 309, or from another device via communication interface 306.

The software instructions contained in main memory 309 may cause processing unit 303 to perform operations or processes described herein, such as the computation of the pre-distortion coefficients. Alternatively, hardwired circuitry may be used in place of or in combination with software instructions to implement processes and/or operations described herein. Thus, implementations described herein are not limited to any specific combination of hardware and software.

Figure 21:
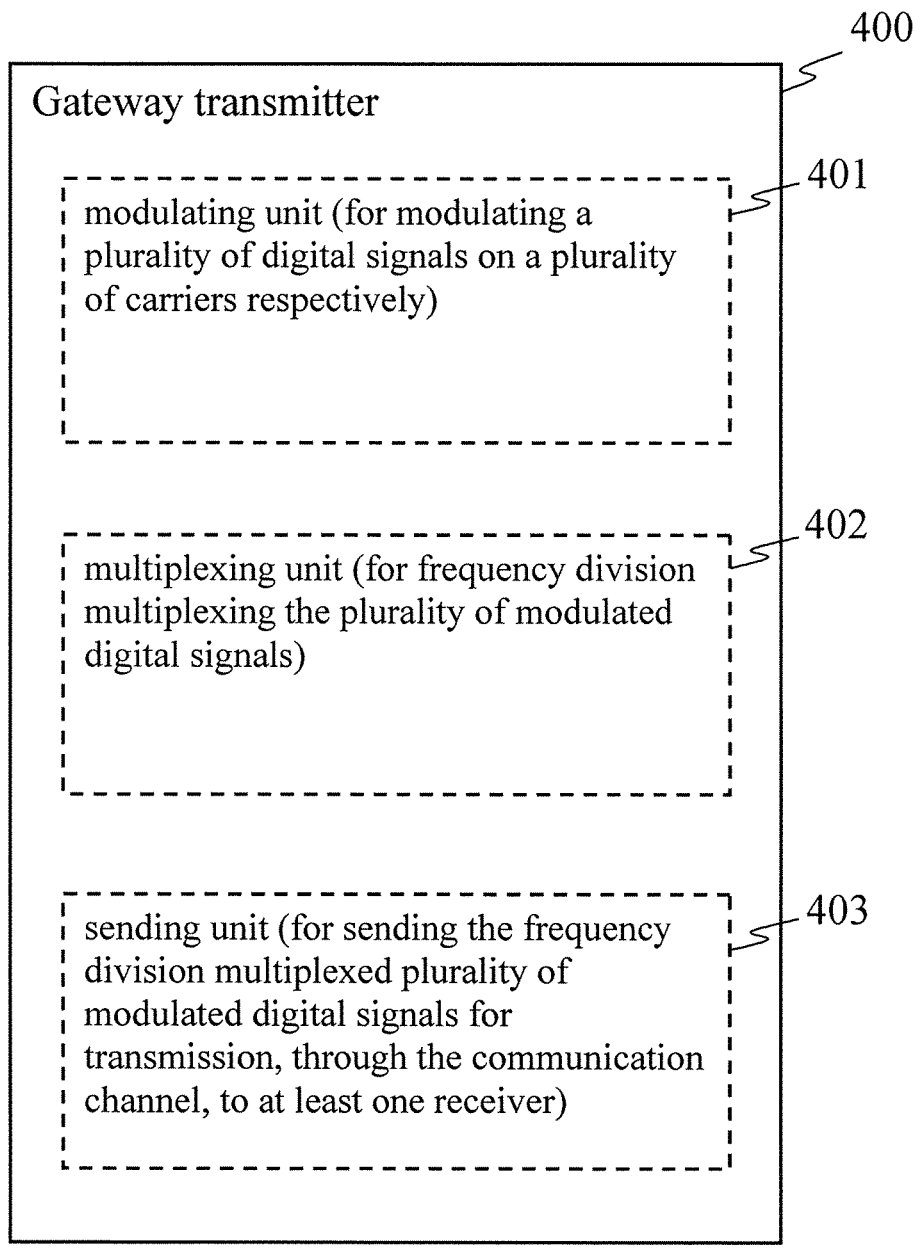
FIG. 21 schematically illustrates a gateway transmitter in one embodiment of the invention.

FIG. 21 schematically illustrates a gateway transmitter 400 configured for compensating, at least partially, the nonlinearities of a communication channel 500 comprising at least one repeater 510. Gateway transmitter 400 may be implemented at least partially on a computer 300 as discussed with reference to FIG. 20.

Gateway transmitter 400 comprises modulating unit 401, a multiplexing unit 402, and sending unit 403. Modulating unit 401 is configured for modulating a plurality of digital signals on a plurality of carriers respectively (i.e., mapping bits to the constellation), wherein, in operation, symbols of the constellation diagram used for modulation of each carrier are distorted in accordance with a pre-distortion function. The actual distortion of the symbols may be carried out in modulating unit 401 (this may for example be applicable to embodiments in which the pre-distortion occurs when modulating, see FIG. 10*a*) or in another functional unit of gateway transmitter 400 (this may for example be applicable to embodiments in which the pre-distortion takes place after modulating, see FIG. 10*b*). Multiplexing unit 402 is configured for frequency division multiplexing the plurality of modulated digital signals. Sending unit 403 is configured for sending the frequency division multiplexed plurality of modulated digital signals for transmission, through the communication channel 500, to at least one receiver 600. The gateway transmitter 400 is such that the pre-distortion function involves a plurality of polynomial functions, each of which taking as input the symbols from all the carriers, and the polynomial functions' coefficients being the "pre-distortion coefficients". The pre-distortion coefficients are computed in accordance with a direct learning approach, the computation being performed jointly for the plurality of carriers, and the computation comprising iteratively updating the pre-distortion coefficients based on received signals being fed back from at least one among the at least one receiver 600 to the gateway transmitter 400.

Initially, i.e. before received fed back signals are available, the pre-distortion coefficients may be set in gateway transmitter 400 as if communication channel 500 had a linear gain with the gain factor being unity. Alternatively, the pre-distortion coefficients may be set in gateway transmitter 400 based on channel model parameters obtained in advance through at least one of tests, simulations and studies carried out on, or regarding, at least one of the communication channel 500; and at least one among the at least one repeater 510.

Where the terms "modulating unit", "multiplexing unit", "sending unit", etc. are used herewith, no restriction is made regarding how distributed these elements may be and regarding how gathered elements may be. That is, the constituent elements thereof may be distributed in different software or hardware components or devices for bringing about the intended function. A plurality of distinct elements may also be gathered for providing the intended functionalities.

Any one of the above-referred units of a gateway transmitter may be implemented in hardware, software, field-programmable gate array (FPGA), application-specific integrated circuit (ASICs), and/or firmware, or the like.

In further embodiments of the invention, any one of the above-mentioned modulating unit 401, multiplexing unit 402, sending unit 403, etc. is replaced by modulating means 401, multiplexing means 402, sending unit 403, etc. respectively, or, by a modulator 401, a multiplexer 402, a transmitter element 403, etc. for performing the functions of the above-mentioned modulating unit 401, multiplexing unit 402, sending unit 403, etc.

In further embodiments of the invention, any one of the above-described steps or processes may be implemented using computer-executable instructions, for example in the form of computer-executable procedures, methods or the like, in any kind of computer languages, and/or in the form of embedded software on firmware, integrated circuits or the like.

Although the present invention has been described on the basis of detailed examples, the detailed examples only serve to provide the skilled person with a better understanding, and are not intended to limit the scope of the invention. The scope of the invention is much rather defined by the appended claims.

Abbreviations:
ACI Adjacent-channel interference
APSK Amplitude and phase-shift keying
BPSK Binary phase-shift keying
DPD Digital pre-distortion
DTH Direct to home DVB-S2 Digital Video Broadcasting-Satellite—Second Generation
EQ Equalization
FIFO First-in-first-out
HPA High power amplifier
IMUX Input multiplexing
ID Identifier
IF Intermediate frequency
RF Radio frequency
IRD Integrated receiver decoder
ISI Intersymbol interference
LMS Least mean squares
MC Multi-carrier
OBO Output Back Off
OFDM Orthogonal frequency-division multiplexing
OMUX Output multiplexing
PSK Phase-shift keying
QPSK Quadrature phase-shift keying
RLS Recursive least squares
TWTA Travelling wave tube amplifier

The invention claimed is:

1. Method, carried out by a transmitter, hereinafter referred to as "gateway transmitter", for compensating, at least partially, nonlinearities of a communication channel comprising at least one repeater, the method comprising:
modulating a plurality of digital signals on a plurality of carriers respectively, wherein symbols of a constellation diagram used for modulation of each carrier are distorted in accordance with a function, hereinafter referred to as "pre-distortion function";
frequency division multiplexing the plurality of modulated digital signals; and
sending the frequency division multiplexed plurality of modulated digital signals for transmission, through the communication channel, to at least one receiver;
wherein
the pre-distortion function involves a plurality of polynomial functions, each of which taking as input the symbols from all the carriers, and the polynomial functions' coefficients being hereinafter referred to as "pre-distortion coefficients", and
the pre-distortion coefficients are computed in accordance with a direct learning approach, the computation being performed jointly for the plurality of carriers, and the computation comprising iteratively updating the pre-distortion coefficients based on received signals being fed back from at least one among the at least one receiver to the gateway transmitter.

2. Method of claim 1, wherein the at least one repeater comprises a transponder on board a satellite.

3. Method of claim 2, wherein the transponder on board the satellite comprises at least one of an input multiplexing filter, an amplifier and an output multiplexing filter.

4. Method of claim 1, wherein the at least one receiver is a plurality of receivers.

5. Method of claim 1, wherein, before received fed back signals are available, the pre-distortion coefficients are set as if the communication channel had a linear gain with a gain factor being unity.

6. Method of claim 1, wherein, before received fed back signals are available, the pre-distortion coefficients are set based on channel model parameters obtained in advance through at least one of tests, simulations and studies carried out on, or regarding, at least one of
the communication channel; and
at least one among the at least one repeater.

7. Method of claim 1, wherein, for each carrier, only one of the plurality of polynomial functions is used for distorting symbols of the constellation diagram used for modulation of that carrier.

8. Method of claim 1, wherein the direct learning approach employs at least one of a recursive least squares filter and a least mean squares filter.

9. Method of claim 1, wherein
the plurality of digital signals being subject to modulation are originally using packets,
each of the packets is assigned a packet identifier,
the packets are kept stored in the gateway transmitter together with their packet identifiers, after transmission,
the received fed back signals are in the form of packets or rearranged, by the gateway transmitter, in the form of packets, and
the computation of the pre-distortion coefficients involves comparing the contents of the received fed back signals' packets with the contents of buffered packets to estimate an error rate caused by the communication channel.

10. Method of claim 1, wherein fed back information on the received signals on all active carriers is required for triggering the process of computing the pre-distortion coefficients.

11. Transmitter, hereinafter referred to as "gateway transmitter", for compensating, at least partially, nonlinearities of a communication channel comprising at least one repeater, the gateway transmitter comprising:
a modulator for modulating a plurality of digital signals on a plurality of carriers respectively, wherein, in operation, symbols of a constellation diagram used for modulation of each carrier are distorted in accordance with a function, hereinafter referred to as "pre-distortion function";
a multiplexer for frequency division multiplexing the plurality of modulated digital signals;
a transmitter element for sending the frequency division multiplexed plurality of modulated digital signals for transmission, through the communication channel, to at least one receiver;
the gateway transmitter being such that
the pre-distortion function involves a plurality of polynomial functions, each of which taking as input the symbols from all the carriers, and the polynomial functions' coefficients being hereinafter referred to as "pre-distortion coefficients", and
the pre-distortion coefficients are computed in accordance with a direct learning approach, the computation being performed jointly for the plurality of carriers, and the computation comprising iteratively updating the pre-distortion coefficients based on received signals being fed back from at least one among the at least one receiver to the gateway transmitter.

12. Gateway transmitter according to claim 11, being such that, in operation, before received fed back signals are available, the pre-distortion coefficients are set as if the communication channel had a linear gain with a gain factor being unity.

13. Gateway transmitter according to claim 11, being such that, in operation, before received fed back signals are available, the pre-distortion coefficients are set based on channel model parameters obtained in advance through at least one of tests, simulations and studies carried out on, or regarding, at least one of the communication channel; and at least one among the at least one repeater.

14. Gateway transmitter according to claim 11, being such that, for each carrier, only one of the plurality of polynomial functions is used for distorting symbols of the constellation diagram used for modulation of that carrier.

15. Gateway transmitter according to claim 11, wherein the direct learning approach employs at least one of a recursive least squares filter and a least mean squares filter.

16. Gateway transmitter according to claim 11, being such that, in operation, the plurality of digital signals being subject to modulation are originally using packets, each of the packets is assigned a packet identifier, the packets are kept stored in the gateway transmitter together with their packet identifiers, after transmission, the received fed back signals are in the form of packets or rearranged, by the gateway transmitter, in the form of packets, and the computation of the pre-distortion coefficients involves comparing the contents of the received fed back signals' packets with the contents of the buffered packets to estimate an error rate caused by the communication channel.

17. Gateway transmitter according to claim 11, being such that fed back information on the received signals on all active carriers is required for triggering the process of computing the pre-distortion coefficients.

18. System comprising a gateway transmitter according to claim 11, and the at least one repeater.

19. System of claim 18, further comprising the at least one receiver.

20. Computer program comprising a non-transitory computer readable medium including computer-readable instructions configured, when executed on a computer, to cause the computer to determine coefficients, hereinafter referred to as "pre-distortion coefficients", involved in a function, hereinafter referred to as "pre-distortion function", for use in distorting symbols of each of a constellation diagrams used for modulation of, respectively, a plurality of carriers carrying a plurality of digital signals, wherein distorting is suitable, in a transmitter, hereinafter referred to as "gateway transmitter", to compensate at least partially, the nonlinearities of a communication channel comprising at least one repeater;

distorting is carried out prior to frequency division multiplexing the plurality of modulated digital signals, and prior to sending the frequency division multiplexed plurality of modulated digital signals for transmission, through the communication channel, to at least one receiver, the pre-distortion function involves a plurality of polynomial functions, each of which taking as input the symbols from all the carriers, and the polynomial functions' coefficients being the above-mentioned pre-distortion coefficients, and the pre-distortion coefficients are computed in accordance with a direct learning approach, the computation being performed jointly for the plurality of carriers, and the computation comprising iteratively updating the pre-distortion coefficients based on received signals being fed back from at least one among the at least one receiver.

* * * * *